United States Patent [19]

Hattori et al.

[11] Patent Number: 5,773,194
[45] Date of Patent: Jun. 30, 1998

[54] LIGHT SENSITIVE COMPOSITION, PRESENSITIZED LITHOGRAPHIC PRINTING PLATE AND IMAGE FORMING METHOD EMPLOYING THE PRINTING PLATE

[75] Inventors: Ryoji Hattori; Tatsuichi Maehashi; Takaaki Kuroki; Sota Kawakami, all of Hino, Japan

[73] Assignee: Konica Corporation, Japan

[21] Appl. No.: 705,134

[22] Filed: Aug. 29, 1996

[30] Foreign Application Priority Data

Sep. 8, 1995 [JP] Japan .................................. 7-231444

[51] Int. Cl.$^6$ ............................ G03F 7/028; G03F 7/038
[52] U.S. Cl. .................................... 430/284.1; 430/285.1; 430/287.1; 430/917; 430/918; 430/914; 430/916; 430/278.1; 522/110; 522/111; 522/112; 522/135; 522/31; 522/60
[58] Field of Search ............................ 430/285.1, 284.1, 430/287.1, 917, 918, 914, 916, 278.1; 522/110, 111, 112, 135, 31, 60

[56] References Cited

U.S. PATENT DOCUMENTS

| | | | |
|---|---|---|---|
| 3,859,261 | 1/1975 | Breslow | 260/79.3 R |
| 4,283,505 | 8/1981 | Kleeberg et al. | 525/281 |
| 4,591,443 | 5/1986 | Brown et al. | 210/747 |
| 4,857,654 | 8/1989 | Riediker et al. | 556/53 |
| 5,153,095 | 10/1992 | Kawamura et al. | 430/175 |
| 5,153,102 | 10/1992 | Lee et al. | 430/284.1 |
| 5,262,278 | 11/1993 | Lauke et al. | 430/287.1 |
| 5,462,835 | 10/1995 | Mirle et al. | 430/287.1 |

FOREIGN PATENT DOCUMENTS

| | | |
|---|---|---|
| 0231002 | 1/1987 | European Pat. Off. . |
| 0248424 | 6/1987 | European Pat. Off. . |
| 0411839 | 2/1991 | European Pat. Off. . |
| 0468289 | 7/1991 | European Pat. Off. . |
| 0496203 | 1/1992 | European Pat. Off. . |
| 0607962 | 7/1994 | European Pat. Off. . |
| 0667561 | 8/1995 | European Pat. Off. . |
| 2164518 | 7/1972 | Germany . |

OTHER PUBLICATIONS

European Search Report EP 96 11 4203 with Annex.
Patent Abstracts of Japan Publication #02289857, dated 29 Nov. 1990 (one page).
Patent Abstracts of Japan Publication #61148444, dated 21 Dec. 1984 (one page).
Derwent XP 002034914 (one page).

*Primary Examiner*—Cynthia Hamilton
*Attorney, Agent, or Firm*—Jordan B. Bierman; Bierman, Muserlian and Lucas

[57] ABSTRACT

A light sensitive composition comprising (a) a vinyl type polymer having a unit represented by the following Formula (1) and a carboxyl group, (b) a monomer, oligomer or polymer containing at least one polymerizable double bond in its molecule, (c) a photopolymerization initiator and (d) a polymerization inhibitor capable of trapping a radical,

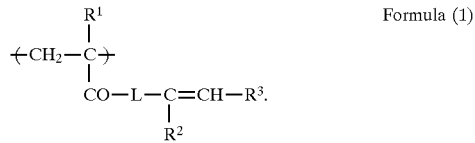

Formula (1)

10 Claims, No Drawings

LIGHT SENSITIVE COMPOSITION, PRESENSITIZED LITHOGRAPHIC PRINTING PLATE AND IMAGE FORMING METHOD EMPLOYING THE PRINTING PLATE

FIELD OF THE INVENTION

The present invention relates to a photopolymerizable light-sensitive composition, a presensitized lithographic printing plate having therein a light-sensitive layer composed of the light-sensitive composition, and further to an image forming method employing the presensitized lithographic printing plate.

BACKGROUND OF THE INVENTION

A photopolymerizable composition has been used commonly as an image forming layer of a negative working presensitized lithographic printing plate. When applying the photopolymerizable composition to a presensitized lithographic printing plate, adhesiveness between an image forming layer composed of a photopolymerizable composition and an aluminum support is important and printing durability related to the adhesiveness characteristics is also important.

However, compared with a presensitized lithographic printing plate having a diazonium salt light-sensitive layer used for an image forming layer of a negative working presensitized lithographic printing plate which is commonly put to practical use, a layer of a photopolymerizable composition is extremely poor in terms of adhesiveness, which is a weak point.

As a technology for overcoming the weak point mentioned above, an aluminum support on which a phosphoric acid anodizing film is formed is disclosed in Japanese Patent Examined Publication No. 46-26521/1971 and an aluminum support treated by polyvinyl phosphonic acid is disclosed in Japanese Patent Examined Publication No. 46-35685/1971. However, layer removal on a non-image area is insufficient and it causes stain on a print, though the adhesiveness is improved for aforesaid both cases. As another technology for overcoming the aforesaid weak point, addition of diazonium salt to a layer of a photopolymerizable composition and a subbing layer containing a diazonium salt are disclosed in Japanese Patent Examined Publication No. 50-7481/1975. However, these methods are not only impossible to be used for direct plate making wherein a laser beam or the like is used because diazonium salt can not be subjected to spectral sensitization, but also are undesirable from the environmental viewpoint.

Though there is disclosed a photopolymerizable composition employing a benzophenone group-containing organic peroxide and organic dyes in Japanese Patent O.P.I. Publication No. 60-76503/1985, it has a problem that its adhesiveness to a support is insufficient, though its sensitivity is high.

Though there is disclosed a photopolymerizable composition containing both acrylic binder containing 2–50 mol % of a glycidyl acrylate unit and polymerizable compound in Japanese Patent O.P.I. Publication No. 61-148444/1986, it has a problem that an image defect is caused because it is easily affected by oxygen and thereby is deteriorated in terms of its efficiency, and an unexposed portion sticks to a grained support not to be dissolved in a developing solution.

In Japanese Patent O.P.I. Publication No. 2-84651/1990, there is disclosed an invention to offer a light-sensitive composition which has high sensitivity and is excellent in storage stability and temperature dependency by employing a photopolymerizable light-sensitive composition having a polymer binder that includes an acrylic structure unit having an acryl group on an end of the side chain. However, there has been a problem of sensitivity drop caused by radical production in course of time and of stain occurrence on non-image portions.

Further, Japanese Patent O.P.I. Publication No. 2-289857/1990 discloses a technology for improving the adhesiveness to a base plate by introducing a unit having a reactive group in a copolymer having a carboxyl group. However, there has been a problem of sensitivity drop caused by radical production in course of time and of stain occurrence on non-image portions.

SUMMARY OF THE INVENTION

The first object of the invention is to provide a photopolymerizable light-sensitive composition which, when applied to a presensitized lithographic printing plate, is excellent in sensitivity and printing durability, and makes it possible to obtain a print with high quality and without stain on a non-image area which produces in course of time, and is free from sensitivity drop caused during a period of its storage and further is capable of being written thereon with a laser beam.

The second object of the invention is to provide an image forming method employing a presensitized lithographic printing plate having a layer of the aforesaid light-sensitive composition.

DETAILED DESCRIPTION OF THE INVENTION

The first object of the invention can be attained by the following items (1) through (16), and the second object of the invention can be attained by the following items (17) through (19).

(1) A light sensitive composition comprising (a) a vinyl type polymer having a unit represented by the following Formula (1) and a carboxyl group, (b) a monomer, oligomer or polymer containing at least one polymerizable double bond in its molecule, (c) a photopolymerization initiator and (d) a polymerization inhibitor capable of trapping a radical,

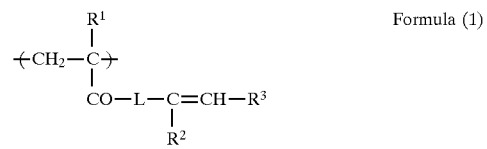

wherein $R^1$ and $R^2$ independently represent a hydrogen atom or a methyl group; $R^3$ represents a hydrogen atom, an alkyl group or an aryl group, provided that when $R^2$ is a methyl group, $R^3$ is a hydrogen atom; and L represents a divalent linkage group, (2) The composition of (1) above, wherein the polymerization inhibitor is a phenol type polymerization inhibitor having an acryloyl group or a methacryloyl group and the content thereof is 0.001 to 5 weight %, (3) A light sensitive composition comprising (a) a vinyl type polymer having a unit represented by Formula (1) above and a carboxyl group, (b) a monomer, oligomer or polymer containing at least one polymerizable double bond in its molecule and (c) an organic peroxide, (4) A light sensitive composition comprising (a) a vinyl type polymer having a unit represented by Formula (1)

above and a carboxyl group, (b) a monomer, oligomer or polymer containing at least one polymerizable double bond in its molecule, (c) an organic peroxide and (d) a phenol type polymerization inhibitor having an acryloyl group or a methacryloyl group, (5) A light sensitive composition comprising (a) a vinyl type polymer having a unit represented by Formula (1) above and a carboxyl group, (b) a monomer, oligomer or polymer containing at least one polymerizable double bond in its molecule and (c) an onium salt, (6) The composition of (5) above, wherein the onium salt is selected from an iodonium salt or a sulfonium salt, (7) The composition of (6) above, wherein the content of the onium salt selected from an iodonium salt or a sulfonium salt is 0.001 to 10 weight %, (8) The composition of (5), (6) or (7) above, further containing a polymerization inhibitor capable of trapping a radical, (9) The composition of (1), (2), (3), (4), (5), (6), (7) or (8) above, wherein the content in the polymer of the unit represented by Formula (1) is 0.001 to 5 weight %,

(10) The composition of (1), (2), (3), (4), (5), (6), (7), (8) or (9) above, wherein L in Formula (1) is —OCH$_2$—CH(OH)—CH$_2$—OCO—,

(11) A presensitized lithographic printing plate comprising an aluminium support having a surface roughness R$_a$ of 0.4 to 0.8 and provided thereon, a light sensitive layer comprising (a) a vinyl type polymer having a unit represented by Formula (1) above and a carboxyl group, (b) a monomer, oligomer or polymer containing at least one polymerizable double bond in its molecule and (c) a photopolymerization initiator,

(12) A presensitized lithographic printing plate comprising an aluminium support having a surface roughness R$_z$ of 3.0 to 6.0 and provided thereon, a light sensitive layer comprising (a) a vinyl type polymer having a unit represented by Formula (1) above and a carboxyl group, (b) a monomer, oligomer or polymer containing at least one polymerizable double bond in its molecule and (c) a photopolymerization initiator,

(13) A presensitized lithographic printing plate comprising an aluminium support having a surface roughness R$_a$ of 0.4 to 0.8 and a surface roughness R$_z$ of 3.0 to 6.0, and provided thereon, a light sensitive layer comprising (a) a vinyl type polymer having a unit represented by Formula (1) above and a carboxyl group, (b) a monomer, oligomer or polymer containing at least one polymerizable double bond in its molecule and (c) a photopolymerization initiator,

(14) The printing plate of (11), (12) or (13) above, wherein the light sensitive layer further contains a fluorine-containing surfactant in an amount of 0.001 to 5 weight %,

(15) The printing plate of claim (11), (12), (13) or (14) above, wherein the content in the polymer of the unit represented by Formula (1) is 0.001 to 5 weight %,

(16) The printing plate of (11), (12), (13), (14) or (15) above, wherein L in Formula (1) is —CH$_2$—CH(OH)—CH$_2$—O—,

(17) An image forming method comprising the step of:
developing a presensitized lithographic printing plate with an aqueous alkaline solution containing an organic solvent in an amount of 0.001 to 20 weight % and having a pH of 9 or more, said printing plate comprising a support and provided thereon, a light sensitive layer comprising (a) a vinyl type polymer having a unit represented by Formula (1) above and a carboxyl group, (b) a monomer, oligomer or polymer containing at least one polymerizable double bond in its molecule and (c) a photopolymerization initiator,

(18) The method of (17) above, wherein the content in the polymer of the unit represented by Formula (1) is 0.001 to 5 weight %, or

(19) The printing plate of (17) or (18) above, wherein L in Formula (1) is —OCH$_2$—CH(OH)—CH$_2$—OCO—.

The invention will be explained in detail below.

The vinyl type polymer containing a unit represented by Formula (1) and a carboxyl group (hereinafter referred to as the vinyl type polymer of the invention) will be explained below.

In Formula (1), the alkyl group represented by R$^3$ includes preferably an alkyl group having 1 to 7 carbon atoms such as methyl or ethyl and the aryl group represented by R$^3$ includes preferably an aryl group having 6 to 10 carbon atoms such as phenhyl or naphthyl. The divalent linkage group represented by L includes —CH$_2$—CH(OH)CH$_2$—O—, —OCH$_2$—CH(OH)CH$_2$—OCO—, —OCH$_2$CH$_2$—OCONH—R$^4$—NHCOOCH$_2$— (R$^4$ represents p-phenylene), —OCH$_2$CH$_2$COOCH$_2$—, and —OCH$_2$CH$_2$OCO—R$^5$—COOCH$_2$— (R$^5$ represents o-phenylene). L represents preferably —CH$_2$—CH(OH)CH$_2$—O—.

The vinyl type polymer of the invention preferably contains the unit represented by Formula (1) in an amount of preferably 0.001 to 10 weight %, more preferably 0.001 to 5 weight %. When the content of the above unit is less than 0.001 weight %, stains during storage, sensitivity lowering or printing durability deterioration are likely to occur. When the content exceeds 5 weight %, especially 10 weight %, gelation during polymerization occurs resulting in poor yield.

The carboxyl group content is preferably 3 to 300, more preferably 10 to 200 in terms of acid value. When the acid value is less than 3, alkaline developer developing is difficult, and when the acid value exceeds 200, insulating is likely to be lowered.

A method of incorporating a carboxyl group in a polymer includes a method of using a monomer containing a carboxyl group, an α,β-unsaturated carboxylic acid such as acrylic acid, methacrylic acid, maleic acid, maleic anhydride, itaconic acid, itaconic anhydride or their derivative as a comonomer in polymerization. There is a method of reacting a copolymer containing an anhydride monomer such as maleic anhydride with an alcohol such as methanol, ethanol, propanol or butanol to incorporate long-chain alkyl or a method of polymer reacting an active group such as hydroxy or amino in a polymer with a dicarboxylic acid or an acid anhydride to incorporate a carboxyl group.

The polymeric compound containing a unit represented by Formula (1) and an α,β-unsaturated carboxylic acid is synthesized by preparing a copolymer containing an α,β-unsaturated carboxylic acid by a conventional method and then reacting an ethylenically unsaturated compound containing a glycidyl group (such as an epoxy group) with the copolymer. The ethylenically unsaturated compound containing a glycidyl group includes glycidyl methacrylate and glycidyl acrylate as a representative, but is not limited thereto and may be an ethylenically unsaturated compound containing a glycidyl group (such as an epoxy group).

The monomer constituting the vinyl type polymer of the invention may contain the following monomers:

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl) acrylamide, N-(2-hydroxyethyl)methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl) methacrylamide, N-(p-aminosulfonylphenyl)acrylamide, (4) A monomer having a sulfonamido group, for example, N-(p-toluenesulfonyl)acrylamide, N-(p-toluenesulfonyl)-methacrylamide, (5) An α,β-unsaturated carboxylic acid, for example, acrylic acid, methacrylic acid, maleic acid, maleic anhydride, itaconic acid, itaconic anhydride, N-(p-toluenesulfonyl)acrylamide, N-(p-toluenesulfonyl)-methacrylamide, (6) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (7) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (8) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (9) A monomer having a fluorinated alkyl group, for example, trifluoroethylacrylate, trifluoroethylmrthacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide,

(10) A vinyl ether, for example, ethylvinyl ether, 2-chloroethylvinyl ether, propylvinyl ether, butylvinyl ether, octylvinyl ether, phenylvinyl ether,

(11) A vinyl ester, for example, vinyl acetate, vinyl chroloacetate, vinyl butate, vinyl benzoate,

(12) A styrene, for example, styrene, methylstyrene, chloromethystyrene,

(13) A vinyl ketone, for example, methylvinyl ketone, ethylvinyl ketone, propylvinyl ketone, phenylvinyl ketone,

(14) An olefin, for example, ethylene, propylene, isobutylene, butadiene, isoprene,

(15) N-vinylpyrrolidone, N-vinylcarbazole, N-vinylpyridine,

(16) A monomer having a cyano group, for example, tacrylonitrile, metacrylonitrile, 2-pentenenitrile, 2-methyl-3-butene nitrile, 2-cyanoethylacrylate, o-cyanostyrene, m-cyanostyrene, p-cyanostyrene,

(17) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide.

The molecular weight of the vinyl type polymer of the invention is preferably 5,000 to 100,000, and more preferably 30,000 to 80,000. When the molecular weight is less than 5,000, coating film forming capability or heat resistance deteriorates, and on the contrary, when the molecular weight exceeds 100,000, gelation occurs during storage, resulting in storage stability deterioration.

The examples of the vinyl type polymeric compound of the invention will be shown below.

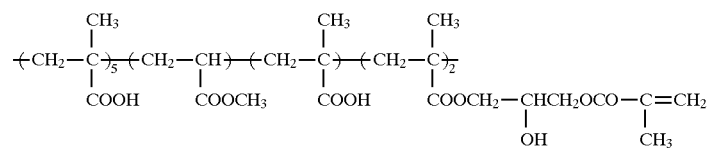

(1)

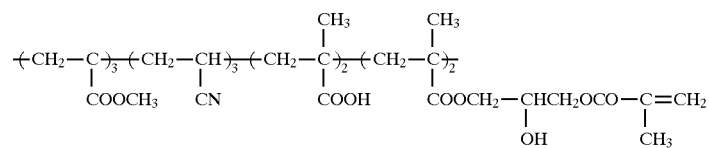

(2)

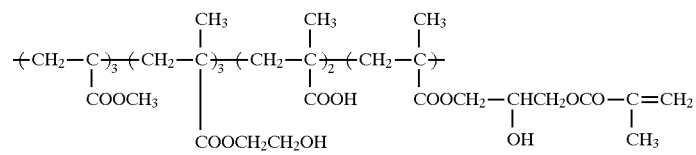

(3)

-continued
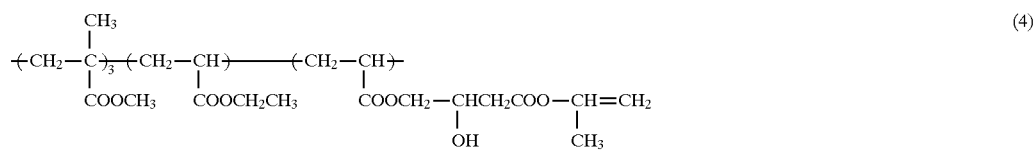
(4)
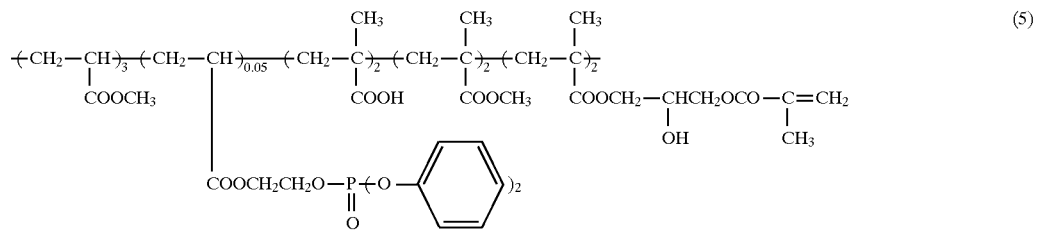
(5)
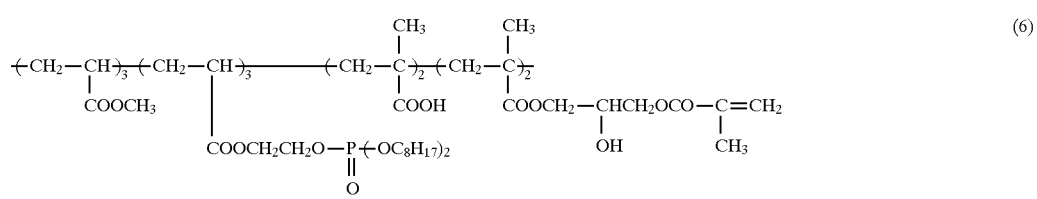
(6)
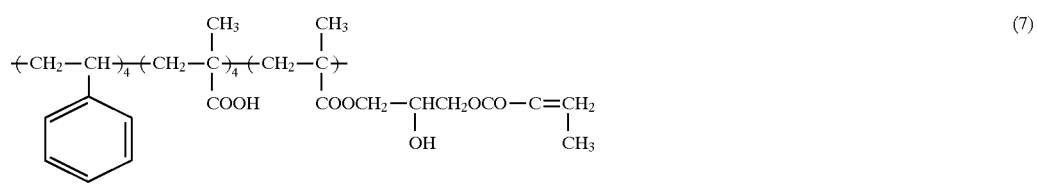
(7)
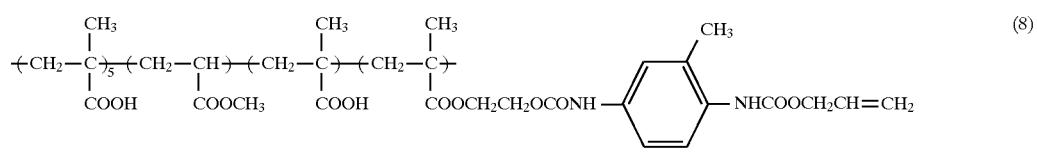
(8)
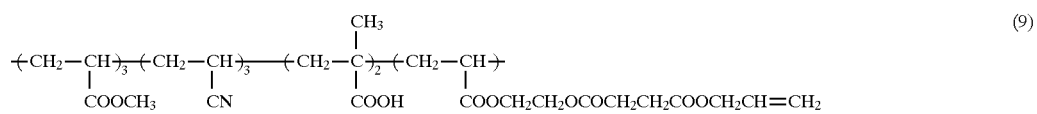
(9)
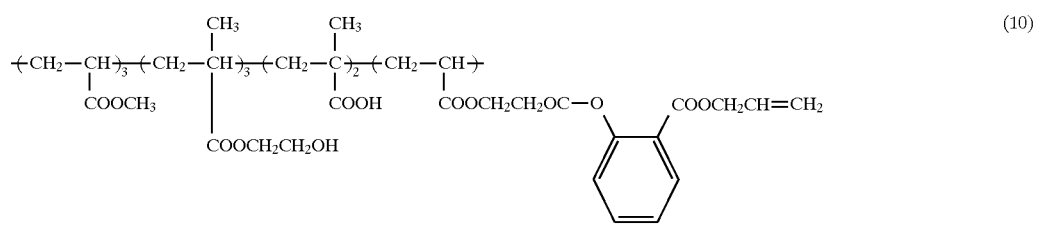
(10)
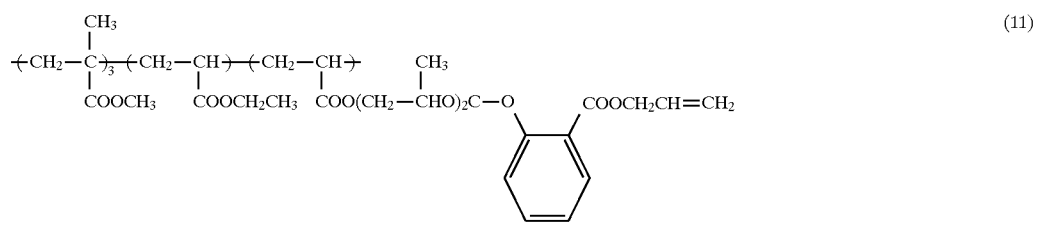
(11)

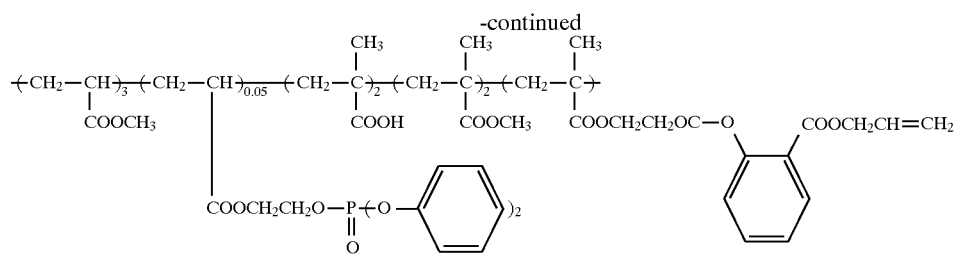

(12)

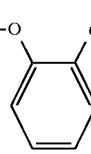

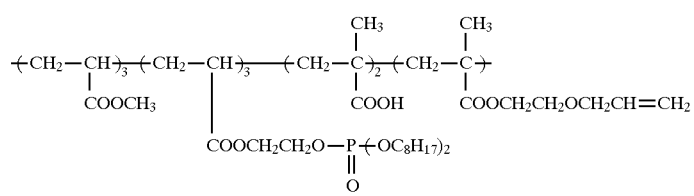

(13)

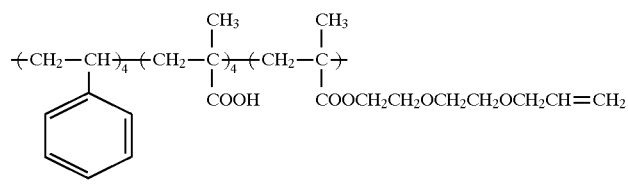

(14)

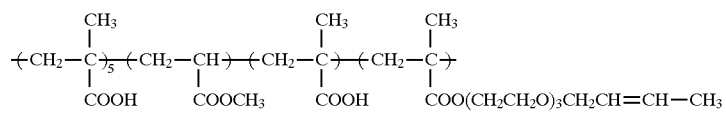

(15)

In items (1) through (16) above, a monomer, oligomer or prepolymer which contains at least one polymerizable double bond in its molecule may be any of a monomer, oligomer or prepolymer containing at least one radical polymerizable ethylenically unsaturated double bond in its molecule, and its conventional compound can be used without any limitations. The examples include a monofunctional acrylate such as 2-ethylhexylacrylate, 2-hydroxypropylacrylate, glycerolacrylate, tetrahydrofurfurylacrylate, phenoxyethylacrylate, nonylphenoxyethylacrylate, tetrahydrofurfuryloxyethylacrylate, an ester of 1,3-dioxane-ε-caprolactone adduct with acrylic acid or 1,3-dioxolane acrylate, a methacrylate, itaconate, crotonate and maleate alternative of the above acrylate, a bifunctional acrylate such as ethyleneglycoldiacrylate, triethyleneglycoldiacrylate, pentaerythritoldiacrylate, hydroquinonediacrylate, resorcindiacrylate, hexanedioldiacrylate, neopentylglycoldiacrylate, tripropyleneglycoldiacrylate, hydroxypivalic acid neopentylglycoldiacrylate, neopentylglycoladipatediacrylate, diacrylate of hydroxypivalic acid neopentylglycol-ε-caprolactone, 2-(2-hydroxy-1,1-dimethylethyl)-5-hydroxymethyl-5-ethyl-1,3-dioxane-diacrylate, tricyclodecane-dimethylolacrylate, tricyclodecanedimethylol-acrylate-ε-caprolactone adduct or 1,6-hexanediol diglycidylether diacrylate, a dimethacrylate, diitaconate, dicrotonate and dimaleate alternative of the above diacrylate, a polyfunctional acrylate such as trimethylolpropanetriacrylate, ditrimethylolpropanetetraacrylate, trimethylolethanetriacrylate, pentaerythritoltriacrylate, pentaerythritoltetraacrylate, dipentaerythritoltetraacrylate, dipentaerythritolpentaacrylate, dipentaerythritolhexaacrylate, dipentaerythritolhexaaacrylate-ε-caprolactone adduct, pyrogallol triacrylate, propionic acid-dipentaerythritol-triacrylate, propionic acid-dipentaerythritoltetraacrylate or hydroxypivalylaldehyde modified dimethylolpropanetriacrylate, a poly-methacrylate, diitaconate, dicrotonate and dimaleate alternative of the above poly-acrylate, a phosphagen monomer, triethylene glycol, isocyanuric acid EO modified diacrylate, isocyanuric acid EO modified triacrylate, dimethyloltricyclodecanediacrylate, trimethylolpropane acrylate benzoate, an alkyleneglycol acrylic acid and urethane modified acrylate. Among these compounds, acrylates and methacrylates are especially preferable. These compounds may be used singly or in combination.

As another compound capable of addition polymerized or cross-linked, a photopolymerizable polymer obtained by incorporating acrylic acid or methacrylic in an olygomer, socalled prepolymer, can be suitably employed. This prepolymer can be used singly, in combination or in admixture with the above described monomers. The examples include polyester (meth)acrylate obtained by incorporating (meth) acrylic acid in a polyester of a polybasic acid such as adipic acid, trimellitic acid, maleic acid, phthalic acid, terephthalic acid, malonic acid, succinic acid, glutaric acid, itaconic acid, pyromellitic acid, fumalic acid, pimelic acid, sebatic acid, dodecanic acid or tetrahydrophthalic acid with polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol, an epoxyacrylate such as bisphenol A·epichlorhydrin·(meth)acrylic acid or phenol novolak·epichlorhydrin·(meth)acrylic acid obtained by incorporating (meth)acrylic acid in an epoxy resin, an urethaneacrylate such as ethylene glycol·adipic acid·tolylenediisocyanate·2-hydroxyethylacrylate, polyethylene glycol·tolylenediisocyanate·2-hydroxyethylacrylate, hydroxyethylphthalylmethacrylate·xylenediisocyanate, 1,2-polybutadieneglycol·tolylenediisocyanate·2-hydroxyethylacrylate or trimethylolpropane·propylene glycol·tolylenediisocyanate·2-hydroxyethylacrylate, obtained by incorporating (meth)acrylic acid in an urethane resin, a silicone acrylate such as polysiloxane acrylate, polysiloxane·diisocyanate·2-hydroxyethylacrylate, and an alkyd modified acrylate obtained by incorporating a methacroyl group in an oil modified alkyd resin and a spiran resin acrylate.

The polymerizable or hardenable compound is used in an amount of 5 weight % (preferably 10 weight %) to 80 weight % (preferably 70 weight %) based on the total light sensitive composition weight.

In items (1), (2), (11), (12), (13) or (17), the photopolymerization initiators include an s-triazine compound having a trihalomethyl group (for example, 2,4,6-tris(trichloromethyl)-s-triazine, 2-(4-methoxyphenyl)-4,6-bis(trichloromethyl)-s-triazine, or a compound disclosed in Japanese Patent O.P.I. Publication No. 2-306247/1990), an iron-allene complex (for example, ($\eta^6$-isopropylbenzene)($\eta^5$-cyclopentadienyl) iron hexafluorophosphate, an onium salt (for example, diphenyliodonium hexafluorophosphate, diphenyliodonium hexafluoroantimonate, diphenyliodonium trifluoromethanesulfonate, dibutylphenacylsulfoniumtetrafluoroborate, dibutyl(4-hydroxyphenyl)sulfoniumtetrafluoroborate, triphenylsulfoniumtrifluoroacetate, triphenylsulfoniumtetrafluoroborate, triphenylsulfoniumhexafluorophosphate, tris(4-thiomethoxyphenyl)hexafluorophosphate, triphenylsulfoniumhexafluoroantimonate, triphenylseleniumhexafluoroantimonate, triphenyltelluroniumhexafluoroantimonate, compounds disclosed in U.S. Pat. No. 4,258,128, J. Polym. Sci. Chem. Ed., 17, 977 (1979), 18, 2677 (1980) and 18, 2697 (1980), Advance in Polym. Sci., 62, 1,(1984)), an aryldiazonium salt, diazoketones, o-nitrobenzylesters, sufonates, silanol-aluminium complexes, halogenated alkoxy containing aromatic compounds disclosed in Japanese Patent O.P.I. Publication No. 4-367865/1992 and halogenated alkyl containing aromatic compounds disclosed in Japanese Patent O.P.I. Publication No. 4-367864/1992.

The organic peroxides contained in the light sensitive composition in items (3) and (4) above are compounds having an oxygen-oxygen bond in the molecule. The examples include ketone peroxides such as methylethyl ketone peroxide, methylisobutyl ketone peroxide, cyclohexanone peroxide and 3,3,5-trimethylcyclohexanone peroxide, diacyl peroxides such as acetylperoxide, propionylperoxide, isobutylylperoxide, octanoylperoxide, 3,5,5-trimethylhexanoylperoxide, decanoylperoxide, lauroylperoxide, benzoylperoxide, p-chlorobenzoylperoxide, 2,4-dichlorobenzoylperoxide and acetylcyclohexanesulfonylperoxide, hydroperoxides such as tert-butylhydroperoxide, cumenehydroperoxide, diisopropylbenzene hydroperoxide, p-metahne hydroperoxide, 2,5-dimethylhexane-2,5-dihydroperoxide, and 1,2,3,3-tetrametylbutyl hydroperoxide, dialkyl peroxides such as di-tert-butylperoxide, tert-butylcumylperoxide, 1,3-bis(tert-butylperoxyisopropyl) benzene, 1,4-bis(tert-butylperoxyisopropyl) benzene, 2,5-dimethyl-2,5-di(tert-butylperoxy)hexane and 2,5-dimethyl-2,5-di(tert-butylperoxy)hexane-3, peroxyketals such as 1,1-bis-tert-butylperoxy-3,3,5-trimethylcyclohexane, n-butyl-4,4-bis(tert-butylperoxy)valeate, and 2,2-bis(tert-butylperoxy) butane, alkylperesters such as tert-butylperoxyacetate, tert-butylperoxyisobutylate, tert-butylperoxyoctate, tert-butylperoxypivalate, tert-butylperoxyneodecanate, tert-butylperoxy-3,5,5-trimethylhexanoate, tert-butylperoxybenzoate, di-tert-butylperoxyphthalate, di-tert-butylperoxyisophthalate, tert-butylperoxylaurate, and 2,5-dimethyl-2,5-dibenzoylperoxyhexane, peroxycarbonates such as di-di-ethylhexylperoxydicarbonate, di-isopropylperoxydicarbonate, di-sec-butylperoxycarbonate, di-n-propylperoxydicarbonate, di-3-methoxybutylperoxydicarbonate, di-ethoxyethylperoxydicarbonate, bis-(4-tert-butylcyclohexyl)peroxydicarbonate, and tert-butylperoxydiisopropylcarbonate, and water soluble peroxides such as succinic acid peroxide.

The onium salt contained in the light sensitive composition in items (5) through (8) above is preferably a sulfonium or iodonium salt. The sulfonium or iodonium salt content of the composition is preferably 0.001 to 10 weight %.

The sulfonium salt includes a compound represented by the following Formula.

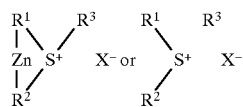

In the above Formula, $R^1$, $R^2$ and $R^3$ may be the same or different, but at least one of $R^1$, $R^2$ and $R^3$ is an aromatic group. The aromatic group is selected from an aromatic group having 4 to 20 carbon atoms (for example, a substituted or unsubstituted phenyl, naphthyl, thienyl or furanyl). The aromatic group may have an alkoxy group, an alkylthio group, an arylthio group, halogen or an alkyl group having 1 to 20 carbon atoms. The term "alkyl group" referred to in the onium salt include a substituted alkyl group such as an alkyl group having halogen, hydroxy, alkoxy or aryl. $R^1$, $R^2$ and $R^3$ independently represent preferably an aromatic group. Z represents oxygen, sulfur,

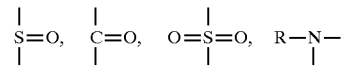

in which R represents an aryl group (having 6–20 carbon atoms, for example, phenyl), an acyl group (having 2 to 20 carbon atoms, for example, acetyl or benzoyl), a carbon—carbon bond or

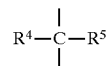

in which $R^4$ and $R^5$ independently represent a hydrogen atom, an alkyl group having 1 to 4 carbon atoms or an alkenyl group having 2 to 4 carbon atoms, n represents 0 or 1, and $X^-$ represents an anion.

The anion is not limited in view of sensitization, but for many purposes, X is preferably selected in such a manner that the aromatic sulfonium compound is present in a complex form of a tetrafluoroborate, hexafluorophosphate, hexafluoroarsenate, hexafluoroantimonate or hydroxypentafluoroantimonate (for example, for a photopolymerization initiator for cationic polymerization in an epoxy resin or a mixture of an epoxy resin and a polyol).

The organic sulfonium salt is well known in the arts. The triaryl sulfonium compound can be synthesized according to a method disclosed in C. H. Wiegand, Synthesis and Reactions of Triarylsulfonium Halides, J. Org. Chem., 33, 2671–2675 (1968). The triaryl sulfonium compound having alkyl can be synthesized according to a method disclosed in K. ohkubo et al., J. Org. Chem., 36, 3149–3155 (1971). A preferable method of synthesizing a triarylsulfonium compound is disclosed in U.S. Pat. No. 2,807,648, and a sulfonium complex can be synthesized from the triarylsulfonium compound. The sulfonium salt can be synthesized from a simple corresponding salt such as bisulfates or halides, metal or ammonium salts or metathesis of an acid having a necessary complex anion.

The sulfonium complex has at least one, preferably three aromatic groups. The typical examples of the aromatic group includes an aromatic group having 4 to 20 carbon atoms, for example, phenyl, thienyl or furanyl. The aromatic group may be condensed with a benzene ring, for example, naphtyl, benzothienyl, dibenzothienyl, benzofuranyl or dibenzofuranyl. The aromatic group optionally has the following group. Such a group includes halogen, nitro, aryl, ester (for example, alkoxycarbonyl such as methoxycarbonyl or ethoxycarbonyl, acyloxy such as phenoxycarbonyl, acetoxy or propionyloxy), aryl (for example, phenyl), alkyl (for example, methyl, ethyl or t-butyl), aryloxy (for example, phenoxy), alkylsulfonyl (for example, methylsulfonyl or ethylsulfonyl), arylsulfonyl (for example, phenylsulfonyl), hydrocarbylthio (for example, p-phenylthio or methylthio), perfluoroalkyl (for example, trifluoromethyl or perfluoroethyl) and perfluoroalkylsulfonyl (for example, trifluoromethylsulfonyl or perfluorobutylsulfonyl).

The suitable aromatic sulfonium complex photopolymerization initiator includes the following:
triphenylsulfonium tetrafluoroborate,
methyldiphenylsulfonium tetrafluoroborate,
dimethylphenylsulfonium hexafluorophosphate,
triphenylsulfonium hexafluorophosphate,
triphenylsulfonium hexafluoroantimonate,
diphenylnaphthylsulfonium hexafluoroarsenate,
tritolylsulfonium hexafluorophosphate,
anisyldiphenylsulfonium hexafluoroantimonate,
4-butoxyphenyldiphenylsulfonium tetrafluoroborate,
4-chlorophenyldiphenylsulfonium hexafluorophosphate,
tri(4-phenoxyphenyl)sulfonium hexafluorophosphate,
di(4-ethoxyphenyl)methylsulfonium hexafluoroarsenate,
4-acetonylphenyldiphenylsulfonium tetrafluoroborate,
4-thiomethoxydiphenylsulfonium hexafluorophosphate,
di(methoxysulfonylmethyl)methylsulfonium hexafluoroantimonate,
di(nitrophenyl)phenylsulfonium hexafluoroantimonate,
di(carbomethoxyphenyl)methylsulfonium hexafluorophosphate,
4-acetoamidophenyldiphenylsulfonium tetrafluoroborate,
dimethylnaphthylsulfonium hexafluorophosphate,
trifluoromethyldiphenylsulfonium tetrafluoroborate,
p-(phenylthiophenyl)diphenylsulfonium hexafluoroantimonate,
10-methylphenoxanthinium hexafluorophosphate,
5-methylthiantholenium hexafluorophosphate,
10-phenyl-9,9-dimethylthioxanthenium hexafluorophosphate, The iodonium salt includes an aromatic iodonium salt represented by the following Formula:

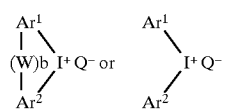

In the above Formula, $Ar^1$ and $Ar^2$ independently represent an aromatic group having 4 to 20 carbon atoms, and preferably phenyl, naphthyl, thienyl, furanyl or pyrazolyl, W represents —O—, —S—,

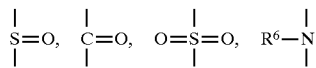

in which $R^6$ represents an aryl group having 6–20 carbon atoms, an acyl group having 2 to 20 carbon atoms (for example, substituted or unsubstituted phenyl, acetyl or benzoyl, denoted above in the two kinds of sulfonium photopolymerization initiators), a carbon—carbon bond or

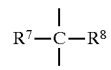

in which $R^7$ and $R^8$ independently represent a hydrogen atom, an alkyl group having 1 to 4 carbon atoms or an alkenyl group having 2 to 4 carbon atoms, b represents 0 or 1, and $Q^-$ represents an anion (the same as denoted above in $X^-$), and preferably a halogen-containing complex ion such as tetrafluoroborate, hexafluorophosphate, hexafluoroarsenate or hexafluoroantimonate.

The useful iodonium salt includes the following:
diphenyliodonium iodide
diphenyliodonium hexafluoroantimonate,
4-chlorophenyliodonium tetrafluoroborate,
di(4-chlorophenyl)iodonium hexafluoroantimonate,
diphenyliodonium hexafluorophosphate,
diphenyliodonium trifluoroacetate,
4-trifluoromethylphenylsulfonium tetrafluoroborate,
diphenyliodonium hexafluoroarsenate,
ditolyliodonium hexafluorophosphate,
di(4-methoxyphenyl)iodonium hexafluoroantimonate,
di(4-methoxyphenyl)iodonium chloride,
(4-methylphenyl)phenyliodonium tetrafluoroborate,
di(2,4-dimethylphenyl)iodonium hexafluoroantimonate,
di(4-t-butylphenyl)iodonium hexafluoroantimonate,
2,2'-diphenyliodonium hexafluorophosphate, The polymerization inhibitor of the light sensitive composition in items (1), (2), (4), (8) and (9) is a polymerization inhibitor having a group capable of trapping a radical. The group capable of trapping a radical includes an acryloyl group, a methacryloyl group, a vinyl group and an allyl group. The polymerization inhibitor in the invention is preferably a hindered phenol having an acroyl, methacroyl, vinyl or allyl group. The example of such an inhibitor includes 2-tert-butyl-6-(3-tert-butyl-2-hydroxy-5-methylbenzyl)-4-methylphenylacrylate and 2-[1-(2-hydroxy-3,5-di-tert-pentylphenyl)methyl]-4,6-di-tert-pentylphenyl acrylate.

Another polymerization inhibitor disclosed in Japanese Patent O.P.I. Publication Nos. 2-273643/1990 and 1-168643/1889.

The polymerization inhibitor content is not more than 10 weight %, and preferably 0.01 to 5 weight % based on the total weight of the vinyl type polymer above and a polymerizable ethylenically unsaturated compound.

As another binder which may be used in combination in the light sensitive composition in items (1) through (10) above, a conventional polymer for binding can be employed. The polymer for binding used in combination includes polyamide, polyester, polycarbonate, polystyrene, polyurethane, polyvinyl chloride or their copolymer, a polyvinyl acetal, polyvinylbutyral, polyvinylformal, shellac, epoxy phenol, acryl or alkyd resin.

Among these polymers, the preferable is a copolymer obtained by copolymerizing a mixture of the following monomers (1) through (17).

Another monomer, which is capable of being copolymerized with the following monomers, may be added to the mixture of the monomers above described.

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl)methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl) methacrylamide, N-(p-aminosulfonylphenyl)acrylamide, (4) A monomer having a sulfonamido group, for example, N-(p-toluenesulfonyl)acrylamide, N-(p-toluenesulfonyl)methacrylamide, (5) An α,β-unsaturated carboxylic acid, for example, acrylic acid, methacrylic acid, maleic acid, maleic anhydride, itaconic acid, itaconic anhydride, N-(p-toluenesulfonyl)acrylamide, N-(p-toluenesulfonyl)methacrylamide, (6) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (7) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (8) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (9) A monomer having a fluorinated alkyl group, for example, trifluoroethylacrylate, trifluoroethylmethacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide,

(10) A vinyl ether, for example, ethylvinyl ether, 2-chloroethylvinyl ether, propylvinyl ether, butylvinyl ether, octylvinyl ether, phenylvinyl ether,

(11) A vinyl ester, for example, vinyl acetate, vinyl chroloacetate, vinyl butate, vinyl benzoate,

(12) A styrene, for example, styrene, methylstyrene, chloromethystyrene,

(13) A vinyl ketone, for example, methylvinyl ketone, ethylvinyl ketone, propylvinyl ketone, phenylvinyl ketone,

(14) An olefin, for example, ethylene, propylene, isobutylene, butadiene, isoprene,

(15) N-vinylpyrrolidone, N-vinylcarbazole, N-vinylpyridine,

(16) A monomer having a cyano group, for example, tacrylonitrile, metacrylonitrile, 2-pentenenitrile, 2-methyl-3-butene nitrile, 2-cyanoethylacrylate, o-cyanostyrene, m-cyanostyrene, p-cyanostyrene,

(17) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide, The weight average molecular weight of the above copolymer is preferably 10,000 to 200,000 measured by gel permeation chromatography (GPC), but is not limiter thereto.

Another polymer such as a polyvinylbutyral, polyurethane, polyamide, polyester, epoxy or novolak resin or a natural resin may be optionally added to the above polymer.

Besides the above polymer are used a conventional polymer disclosed in Kiyoshi Akamatsu, "Sin Kankosei jusi no jissaigijutsu" published by CMC Corp., or "10188 no Kagakushohin" published by Kagakukogyo Nippo Sha, 657–767(1988).

The polymer content of the light sensitive composition is preferably 20 to 80 weight %, and more preferably 30 to 70 weight %.

The light sensitive composition in items (1) through (10) above may contain a dye.

The dye is used for obtain a visible image after exposure (exposure visible image) or after development.

The dye is preferably a dye varying its color on reaction with a free radical or an acid. The term "varying its color" includes changing colorless to color, color to colorless or changing its color. The preferable dye is a dye varying its color by forming a salt with an acid.

The examples of the dyes changing its color to colorless or changing its color include a triphenylmethane dye such as Victoria Pure Blue BOH (produced by Hodogaya Kagaku Co. Ltd.), Oil Blue #603 (produced by Orient Kagaku Co. Ltd.), Patent Pure Blue (produced by Sumitomomikuni Kagaku Co. Ltd.), Crystal Violet, Brilliant green, Ethyl Violet, Methyl Violet, Methyl Green, Erythrosine B, Basic Fuchsin, Malachite Green, Oil red, m-Cresol Purple, Rhodamine B, Auramine, 4-p-diethylaminophenyliminonaphthoquinone or cyano-p-diethylaminophenyl-acetoanilide or a diphenylmethane, oxazine, xanthene, iminonaphthoquinone, azomethine or anthraquinone dye.

The examples of the dyes changing from colorless to color include a leuco dye or a primary or secondary amine such as triphenylamine, diphenylamine, o-chloroaniline, 1,2,3-triphenylguanidine naphthylamine, diaminodiphenylmethane, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o- methyltriphenylmethane or p,p'-bis-dimethylaminodiphenyl-4-anilinonaphthylmethane.

The dye added to a light sensitive composition may be a dye for only coloring the light sensitive composition. Such a dye includes an organic pigment such as phthalocyanine pigment, copper phthalocyanine lake blue pigment, dioxazine pigment, zulene pigment, basic dye and the preferable pigment is phthalocyanine pigment or dioxazine pigment. In order to dipersing such pigment in the composition, the pigment is preferably added in admixture with a dispersing agent such as ε-caprolactone, a cationic surfactant, an anionic surfactant, a nonionic surfactant, a polyurethane resin, a vinyl resin or an unsaturated polyester (disclosed in "Saishin, Pigment Dispersion Technique" issued by Gijutsu Joho Kyokai Co., Ltd.).

Among these dyes or pigment, a triphenylmethane, diphenylmethane or phthalocyanine type dye is preferable.

The above dye content of the light sensitive composition is ordinarily 0.5 to 10 weight %, preferably about 1 to 7.5 weight % based on the total solid components.

The light sensitive composition in the above items 1 through 10 may contain any of the following additives (1) through (7):

(1) Coupling agent

A silane coupling agent, a titanium coupling agent, an aluminium coupling agent, or a coupling agent disclosed in Japanese Patent O.P.I. Publication Nos. 2-4258/1990 and 4-161957/1992. The coupling agent content of the light sensitive composition is 1 to 20 weight %. The coupling agent may be contained in a layer or a support.

(2) Thermal polymerization inhibitor

The thermal polymerization inhibitor is preferably a quinone or phenol type compound, for example, hydroquinone, pyrogallol, p-methoxyphenol, catechol, β-naphtol or 2,6-di-t-butyl-p-cresol. The inhibitor content is not more than 10 parts by weight, and preferably 0.01 to 5 parts by weight based on the 100 parts by weight of a polymerizable ethylenically unsaturated compound and a binder.

(3) Oxygen quencher

The ygen quencher is preferably an N,N-dialkylaniline derivative, for example, a compound disclosed in column 11, line 58 to column 12, line 35 of U.S. Pat. No. 4,772,541.

(4) Plasticizer

The plasticizer includes phthalates, trimellitates, adipates, or another saturated or unsaturated carboxylate, citrates, epoxy soybean oil, epoxy linseed oil, epoxystearic epoxides, phosphates, phosphites, and glycol esters.

(5) Anti-oxidant

The anti-oxidant includes a chromane compound, phenol derivatives, hydroquinone derivatives, hindered amine derivatives, spiroindanes, sulfur-containing compounds, phosphor-containing compounds, compounds disclosed in Japanese Patent O.P.I. Publication Nos. 59-182785/1984, 60-130735/1985, 61-159644/1986 and 1-127389/1989, and compounds disclosed in Kagakukogyo Nipposha, "11290 Chemical Compounds", pages 862 to 868 and compounds well known as those improving durability of photographic or other image forming materials.

(6) Fillers

The fillers include inorganic or organic fine particles. The inorganic fine particles include silica gel, calcium carbonate, zinc oxide, barium sulfate, talc, clay, kaorine, Japanese acid clay, activated clay and alumina. The organic fine particles include fluorine-containing resin particles, guanamine resin particles, acryl resin particles, and silicone resin particles.

(7) Anti-static agent

The anti-static agent include a cationic surfactant, an anionic surfactant, a nonionic surfactant, a polymer anti-static agent, conductive fine particles and compounds disclosed in Kagakukogyo Nipposha, "11290 Chemical Compounds", pages 875 and 876.

The sensitivity of the light sensitive composition of the invention is increased by adding various sensitizing agents to enhance activity to a light of ultraviolet to near-infrared range. Thus, a high sensitive polymerizable composition is obtained. The examples of the sensitizing agents in the invention include unsaturated ketones such as chalcone derivatives and dibenzalacetones, 1,2-diketone derivatives such as benzyl or camphor quinone, benzoine derivatives, fluorenone derivatives, naphthoquinone derivatives, anthraquinone derivatives, xanthene derivatives, thioxanthene derivatives, xanthone derivatives, thioxanthone derivatives, cumarine derivatives, ketocumarine derivatives, polymethine dyes such as cyanine derivatives, styryl derivatives, merocyanine derivatives or oxonol derivatives, acridine derivatives, azine derivatives, thiazine derivatives, oxazine derivatives, indoline derivatives, azulene derivatives, azulenium derivatives, squarium derivatives, porphyline derivatives, tetraphenylporphyline derivatives, triarylmethane derivatives, tetrabenzoporphyline derivatives, tetrapyrazinoporphyline derivatives, phthalocyanine derivatives, tetraazaporphylazine derivatives, tetraquinoxaliroporphylazine derivatives, naphthalocyanine derivatives, subphthalocyanine derivatives, pyrilium derivatives, thiopyrilium derivatives, tetraphyrine derivatives, anulene derivatives, spiropyrane derivatives, spiroxazine derivatives, metaloallene derivatives, organic ruthenium complex, and dyes or sensitizers described in Makoto Ogahara et al., "Shikiso Handbook", Kodansha, 1986, Makoto Ogahara et al., "Kinoseishikiso no Kagaku", (CMC Co., 1981) and Chuzaburo Ikemori et al., "Tokushu kinozairyo" (CMC Co., 1986), but are not limited thereto. Besides them, the examples include dyes or sensitizers absorbing a light of ultraviolet to near-infrared range, and they may be optionally used in two or more kinds in any mixture proportion. The sensitizing agent content is preferably 0.01 to 10 parts by weight, and more preferably 0.5 to 5 parts by weight.

The polymerization promoting agent and chain transfer catalyst can be added to the composition of the invention. The examples thereof includes amines such as N-phenyl glycine, triethanolamine, and N,N-diethylaniline, thiols as disclosed in U.S. Pat. No. 4,414,312 and Japanese Patent O.P.I. Publication No. 64-13144/1988, disulfides as disclosed in Japanese Patent O.P.I. Publication No. 2-291561/1990, thions as disclosed in U.S. Pat. No. 3,558,322 and Japanese Patent O.P.I. Publication No. 64-17048/1988, o-acylthiohydroxamate or N-alkoxypyridinethions as disclosed in Japanese Patent O.P.I. Publication No. 2-291560/1990. The composition of the invention may optionally contain dyes, organic or inorganic pigment, oxygen removing agents such as phosphines, phospates and phosphites, a reducing agent, anti-foggants, an anti-fading agent, an anti-halation agent, a brightening agent, a surfactant, a coloring agent, fillers, a plasticizer, a non-flammable agent, an anti-oxidant, a UV absorbing agent, a forming agent, an anti-fungal, an anti-static agent, magnetic substances, other additives giving other characteristics and a diluting agent.

The composition of the invention may further contain various additives other than those described above, for example, alkylethers (such as ethylcellulose or methylcellulose), a fluorine-containing surfactant, a nonioic surfactant (such as Pluronic L-64 produced by Asahidenka Co., Ltd.), a plasticizer for giving flexibility or antiabrasion to the coated layer (such as polyethylene glycol, tributylcitrate, tetrahydrofurfuryloleate, an olygomer or polymer of acrylic acid or methacrylic acid), an lipophilic agent for improving a lipophilicity of image portions (such as an alcohol half ester of styrene-maleic anhydride copolymer disclosed in Japanese Patent O.P.I. Publication No. 55-527/1980, a long chained alkyl group containing novolak resin disclosed in Japanese Patent O.P.I. Publication No. 50-125806/1975, a stabilizing agent (such as phosphoric acid, phosphorous acid, an organic acid, for example, citric acid, oxalic acid, benzenesulfonic acid, naphthalene sulfonic acid, 4-methoxy-2-hydroxybenzophenone-5-sulfonic acid, glutaric acid), a development accelerator (such as higher alcohols or acid anhydrides). The content of these additives is generally 0.01 to 30 weight % based on the total solid component weight of the composition, although it varies depending on the objects of the usage.

The presensitized lithographic printing plate in the invention is obtained by dissolving the light sensitive composition described above in a solvent to obtain a coating solution, coating the solution on a support and then drying the coated to form a light sensitive layer on the support. The solvent includes ketones such as methylethylketone, methylisobutylketone, cyclohexanone and dibutylketone, esters such as ethyl acetate, butyl acetate, amyl acetate, ethyl propionate, methyl lactate, dimethylphthalate, and ethyl benzoate, aromatic hydrocarbons such as toluene, xylene and monochlorobenzene, halogenated hydrocarbons such as carbon tetrachloride, trichloroethylene, trichloroethane and perchloroethylene, ethers such as methyl cellosolve, ethyl cellosolve, butyl cellosolve and propylene glycol monomethyl ether, alcohols such as ethanol, propanol, propylene glycol, 1-methoxy-2-propanol and 1-ethoxy-2-propanol, dimethyl sulfoxide, dimethylformamide, tetrahydrofurane, N-methylpyrrolidone, dimethylimidazolidine and a mixture thereof.

It is preferable that a concentration of light-sensitive composition in a coating solution is within a range of 1–50 wt %.

It is possible to use a light-sensitive composition by coating on a glass plate, an aluminum plate, a plate of other metal and a polymer film such as polyethyleneterephthalate.

For the purpose of coating, conventional methods such as, for example, methods of whirler coating, wire bar coating, dip coating, air knife coating, roll coating, blade coating and curtain coating can be used.

In this case, a coating weight for a light-sensitive composition can be about 0.2–10 g/m$^2$ in terms of weight of dried coating.

A light-sensitive composition of the invention is polymerized in a polymerizing reaction when it is given light energy of ultraviolet rays, visible light or near infrared light and/or heat energy by means of heating or a thermal head in a solvent inactive for a polymerization starting agent and a compound having ethylenically unsaturated bond capable of radical polymerizing.

A light-sensitive composition of the invention makes it possible to obtain targeted polymerized products and hardened products by giving light energy from various light sources such as a low-pressure mercury lamp, a medium-pressure mercury lamp, a high-pressure mercury lamp, an ultra-high-pressure mercury lamp, a xenon lamp, a carbon arc lamp, a metal halide lamp, a fluorescent lamp, a tungsten lamp, an algon ion laser, a helium cadmium laser, a helium neon laser, a krypton ion laser, various semi-conductor lasers, a YAG laser, a light-emitting diode, a CRT light source and a plasma light source and/or heat energy produced by heating or by a thermal head.

It is therefore possible, by coating on a support together with a binder and others, to apply to light-sensitive materials such as various kinds of ink, various kinds of printing plates, photoresist, electrophotographic prints, direct printing plate materials and hologram materials, various recording media such as microcapsule or the like and further to adhesives, sticking agent, sticking adhesive, sealing agent and various kinds of paint.

A light-sensitive layer of a presensitized lithographic printing plate of the invention is one composed of a light-sensitive composition containing at least (a) a vinyl type polymer of the invention, namely, a vinyl type polymer having a unit represented by aforesaid Formula (1) and a carboxy group, (b) a monomer or an oligomer having at least one polymerizable double bond in a molecule, and (c) a photopolymerization initiator. In the presensitized lithographic printing plate, it is preferable that an amount of the unit represented by Formula (1) in the vinyl type polymer of the invention contained in a light-sensitive layer is within a range of 0.001–5 wt %. Further, the light-sensitive layer can contain photopolymerization initiator and/or polymerization-inhibiting agent contained in the light-sensitive composition of the invention related to items (1)–(10).

From the viewpoint of preventing occurrence of stain on a non-image area in course of time, it is preferable that a light-sensitive layer of a presensitized lithographic printing plate of the invention contains 0.001–5 wt % of a fluorine-containing surfactant.

As a fluorine-containing surfactant, following compounds, for example, are given.

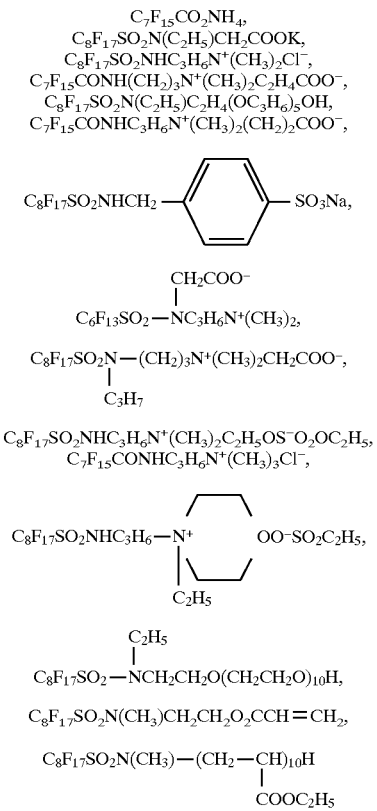

With regard to a fluorine-containing surfactant, it is also possible to use those available on the market, and examples of them include, for example, Surflon "S-38", "S-382", "SC-101", "SC-102", "SC-103", "SC-104" (all are made by Ashi Glass Co.), Fluorad "FC-430" "FC-431", "FC-173" (all made by Fluorochemical-Sumitomo 3M), Eftop "EF 352", "EF 301", "EF 303" (all are made by Shin-Akita Kasei Co.), Schwegolfer "8035", "8036" (all are made by Schwegman Co.), "BM1000", "BM1100" (all are made by B.M. Hymie Co.), and Megafac "F-171", "F-177" (all are made by Dainihon Ink Kagaku Co.). The fluorine content of the fluorine-containing surfactant in the invention is 0.05–2% and preferably is 0.1–1%. The content in to a protective layer of the surfactant preferably is 0.001–10%. Aforesaid fluoric surfactant can be used either independently or in combination of two or more kinds thereof. It can further be used in combination with other surfactants. It is possible to make a protective layer of the invention related to item 1 or 2 to contain other additives (for example, antioxidant etc.). As a method for providing a protective layer on a light-sensitive layer of a presensitized lithographic printing plate of the invention, there may be given a method of coating and a method of sticking together.

A presensitized lithographic printing plate of the invention related to items (1) or item (2) (hereinafter referred to as "the present invention") prepared as stated above is first subjected to imagewise exposure conducted by active light. As active light in this case, there can be used any light provided that a photopolymerization starting agent contained in aforesaid photopolymerizing and light-sensitive composition can be exposed to the light, and there may be given, for example, a mercury lamp, a xenon lamp and a laser beam.

When applying a light-sensitive composition of the invention to a light-sensitive layer of a presensitized lithographic printing plate, it is preferable to use, as a support, an aluminum support whose surface roughness on the light-sensitive layer side is within a range of 0.4–0.8 in terms of Ra and/or 3.0–6.0 in terms of Rz. When the surface roughness is lower than 0.4 in terms of Ra, it lowers both sensitivity and printing durability though it causes less stain caused by storage. When the surface roughness exceeds 0.8, on the contrary, it worsens stain caused by storage though it improves both sensitivity and printing durability. When the surface roughness in terms of Rz is lower than 3.0, it lowers both sensitivity and printing durability though it causes less stain caused by storage, and when it exceeds 6.0, on the contrary, it worsens stain caused by storage though it improves both sensitivity and printing durability.

An aluminum plate used for a support of a presensitized lithographic printing plate of the invention includes a pure aluminum plate and an aluminum alloy plate. An aluminum alloy to be used includes various ones wherein aluminum and each of silicon, copper, manganese, chromium, zinc, lead, bismuth, nickel, titanium, sodium and iron are alloyed.

In the invention, an aluminum plate is preferably subjected to degreasing treatment for removing rolling oil on the surface, prior to roughening. The degreasing treatment to be used includes one employing a solvent such as trichlene or thinner, and emulsion degreasing treatment employing an emulsion such as kesilone and triethanol. It is also possible to use an aqueous solution containing alkali such as caustic soda for the degreasing treatment. When alkali aqueous solution such as caustic soda is used for the degreasing treatment, it is possible to remove even a stain and oxide film which can not be removed by aforesaid degreasing treatment alone.

When an aqueous solution containing alkali such as caustic soda is used for the degreasing treatment, smut is caused on the surface of a support. In this case, it is preferable to perform desmutting treatment by dipping in an acid such as phosphoric acid, nitric acid, sulfuric acid and chromic acid, or in mixed acid thereof.

There is no limitation in particular for a mechanical roughening method to be used, and a brush-roughening method and a honing method are preferable. Roughening operation by means of a brush-roughening method is conducted by pressing a rotating rotary brush employing bristles each having a diameter of 0.2–0.8 mm for example while supplying slurry wherein particles of volcanic ashes each having a particle size of 10–100 $\mu$m are dispersed uniformly in water, for example, to the surface of a support. Roughening operation by means of a honing method is conducted by causing, for example, particles of volcanic ashes each having a particle size of 10–100 $\mu$m dispersed uniformly in water to be jetted under pressure so that they are blasted slantwise on the surface of a support. It is also possible to conduct roughening operation by pasting on the surface of a support a sheet wherein abrasive particles each having a particle size of 10–100 $\mu$m are coated on the surface of a support so that they show a particle distance of 100–200 $\mu$m and density of $2.5 \times 10^3$–$10 \times 10^3$ pieces/cm$^2$, and by applying pressure on them so that patterns of the rough surface of the sheet may be transferred onto the support.

It is preferable, after roughening a support through aforesaid mechanical roughening method, to soak the support in an aqueous solution containing an acid or alkali for the purpose of removing abrasives used in the mechanical roughening method and are pressed in the surface of the support and of removing aluminum dust formed. An acid to be used in this case includes a sulfuric acid, a persulfuric acid, a hydrofluoric acid, a phosphoric acid, a nitric acid and a hydrochloric acid, for example, and a base to be used includes sodium hydroxide and potassium hydroxide, for example. Among them, an alkali aqueous solution is preferable to be used. It is preferable that an amount of aluminum dissolved in the surface is 0.5–5 g/m$^2$.

After the soaking treatment in an aqueous solution of alkali, neutralizing treatment is preferably conducted by soaking in an acid such as phosphoric acid, nitric acid, sulfuric acid and chromic acid or in mixed acid thereof.

Though there is no limitation also for an electrochemical roughening method in particular, a method for roughening electrochemically in an acid electrolyte is preferable. With regard to the acid electrolyte, though an acid electrolyte used commonly for an electrochemical roughening method can be used, it is preferable to use nitric acid electrolyte. As an electrochemical roughening method, those disclosed in Japanese Patent Examined Publication No. 28123/1973, British Patent No. 896,563 and Japanese Patent O.P.I. Publication No. 67507/1978 can be used.

Though the electro-chemical roughening method can generally be performed by impressing a voltage within a range of 1–50 volts, it is preferable to select voltage to be impressed from a range of 10–30 volts when finishing the surface of an aluminum plate to be the same as the state of the invention. Though a range of 10–200 A/dm$^2$ can be used for current density, it is preferable to select it from a range of 50–150 A/dm$^2$ when finishing the surface of an aluminum plate to be the same as the state of the invention. Though a range of 100–5000 c/dm$^2$ can be used for quantity of electricity, it is preferable to select it from a range of 100–2000 c/dm$^2$, further from a range of 200–1000 c/dm$^2$ when finishing the surface of an aluminum plate to be the same as the state of the invention. Though a range of 10°–50° C. can be used for a temperature for performing the electrochemical roughening method, it is preferable to select it from a range of 15°–45° C. when finishing the surface of an aluminum plate to be the same as the state of the invention.

When performing the electrochemical roughening method by using a nitric acid electrolyte as an electrolyte, it is generally possible to perform it by impressing voltage within a range of 1–50 volts. When finishing the surface of an aluminum plate to be the same as the state of the invention, however, it is preferable to select a voltage to be impressed from a range of 10–30 volts. Though a range of 10–200 A/dm$^2$ can be used for current density, it is preferable to select it from a range of 20–100 A/dm$^2$ when finishing the surface of an aluminum plate to be the same as the state of the invention. Though a range of 100–5000 c/dm$^2$ can be used for quantity of electricity, it is preferable to select it from a range of 100–2000 c/dm$^2$ when finishing the surface of an aluminum plate to be the same as the state of the invention. Though a range of 10°–50° C. can be used for a temperature for performing the electro-chemical roughening method, it is preferable to select it from a range of 15°–45° C. when finishing the surface of an aluminum plate to be the same as the state of the invention.

It is preferable that nitric acid density in an electrolyte is 0.1–5 wt %. In case of need, a nitrate, a chloride, amines, aldehydes, a phosphoric acid, a chromic acid, a boric acid, an acetic acid or an oxalic acid can be added to an electrolyte.

When performing the electro-chemical roughening method by using a nitric acid electrolyte as an electrolyte, it is generally possible to perform it by impressing voltage within a range of 1–50 volts. When finishing the surface of an aluminum plate to be the same as the state of the invention, however, it is preferable to select a voltage to be impressed from a range of 2–30 volts. Though a range of 10–200 A/dm$^2$ can be used for current density, it is preferable to select it from a range of 50–150 A/dm$^2$ when finishing the surface of an aluminum plate to be the same as the state of the invention. Though a range of 100–5000 c/dm$^2$ can be used for quantity of electricity, it is preferable to select it from a range of 100–2000 c/dm$^2$, further from a range of 200–1000 c/dm$^2$ when finishing the surface of an aluminum plate to be the same as the state of the invention. Though a range of 10°–50° C. can be used for a temperature for performing the electrochemical roughening method, it is preferable to select it from a range of 15°–45° C. when finishing the surface of an aluminum plate to be the same as the state of the invention.

It is preferable that hydrochloric acid density in an electrolyte is 0.1–5 wt %. In case of need, a nitrate, a chloride, amines, aldehydes, a phosphoric acid, a chromic acid, a boric acid, an acetic acid or an oxalic acid can be added to an electrolyte.

It is preferable, after roughening a support through aforesaid mechanical roughening method, to soak the support in an aqueous solution containing an acid or alkali for the purpose of removing aluminum dust or the like staying on the surface. An acid to be used in this case includes a sulfuric acid, a persulfuric acid, a hydrofluoric acid, a phosphoric acid, a nitric acid and a hydrochloric acid, for example, and a base to be used includes sodium hydroxide and potassium hydroxide, for example. Among them, an alkali aqueous solution is preferable to be used. Among them, an alkali aqueous solution is preferable to be used. It is preferable that an amount of aluminum dissolved in the surface is 0.5–5 g/m$^2$.

It is preferable, after performing the soaking treatment with an alkali aqueous solution, to conduct neutralizing treatment by soaking in an acid such as a phosphoric acid, a nitric acid, a sulfuric acid or a chromic acid or in a mixed acid of them.

Each of a mechanical roughening method and an electrochemical roughening method may be used independently for roughening, or they may be used in combination for roughening in a way that the electrochemical roughening method follows the mechanical roughening method. Treatment conditions for the mechanical roughening method or the electrochemical roughening method are selected so that the finished surface state of an aluminum plate may be the same as that of the invention. The selection of the conditions can be made through a simple experiment.

After the roughening treatment, there is conducted anodizing treatment.

There is no limitation, in particular, for an anodizing method usable in the invention, and known methods can be used. Anodizing treatment forms an oxide film on a support. In the invention, anodizing treatment employs preferably a method of electrolyzing with current density of 1–10 A/dm$^2$ in an electrolyte of an aqueous solution containing a sulfuric acid and/or a phosphoric acid at 10–50% density. In addition to that, a method of electrolyzing at high current density in a sulfuric acid described in U.S. Pat. No. 1,412,768 and a method of electrolyzing by the use of a phosphoric acid described in U.S. Pat. No. 3,511,661 can be used.

A support subjected to anodizing treatment can further be subjected to sealing of anodic oxide coating, in case of need. Known methods such as hot water treatment, boiled water treatment, steam treatment, sodium silicate treatment, dichromate aqueous solution treatment, nitrite treatment and ammonium acetate treatment can be used for the sealing of anodic oxide coating.

It is preferable that the support is further provided with a hydrophilic layer. For forming the hydrophilic layer, it is possible to use alkali metal silicate described in U.S. Pat. No. 3,181,461, hydrophilic cellulose described in U.S. Pat. No. 1,860,426, an amino acid and its salt described in Japanese Patent O.P.I. Publication Nos. 149491/1985 and 165183/1988, amines and their salts described in Japanese Patent O.P.I. Publication No. 165183/1988, phosphate described in Japanese Patent O.P.I. Publication No. 19494/1987 and high polymer compounds including monomer unit having a sulfo group described in Japanese Patent O.P.I. Publication No. 101651/1984 and a diazonium compound described in Japanese Patent O.P.I. Publication Nos. 59-192250/1984, 6-3810/1994 and 7-159983/1995.

Further, for preventing that scratches are caused on a light-sensitive layer when presensitized lithographic printing plates are stacked, and for preventing that aluminum components liquate out in a developing solution in the course of development, it is possible to conduct processing for providing a protective layer on the back side of a support described in Japanese Patent O.P.I. Publication Nos. 151136/1975, 63293/1982, 73538/1985, 67863/1986 and 35174/1994.

The presensitized lithographic printing plate of the invention may be provided with a protective layer containing water-soluble resins which are dissolved at 1% or more in water of 25° C. The water-soluble resin that can be used includes, for example, polymers excellent in oxygen-interception such as polyvinyl alcohol, polyvinylacetal, maltotriose and acid cellulose. It is preferable that a compound containing fluorine such as, for example, a fluorine type surfactant, a nonionic surfactant, an anionic surfactant, or a cationic surfactant is added to the protective layer.

In a method for obtaining a presensitized lithographic printing plate of the invention, an aluminum plate is subjected to roughening treatment and anodizing treatment so that the surface of the aluminum plate may be finished to be the specific state mentioned above, and a coating solution wherein aforesaid light-sensitive composition is dissolved in a solvent is coated on the surface of the aluminum plate so that a layer containing a light-sensitive composition may be provided thereon.

The solvent for dissolving the light sensitive composition includes methylcellosolve, methylcellosolve acetate, ethylcellosolve, ethylcellosolve acetate, diethylene glycol monomethylether, diethylene glycol monoethylether, diethylene glycol dimethylether, diethylene glycol methylethylether, diethylene glycol diethylether, diethylene glycol monoisopropylether, propylene glycol, propylene glycol monoethylether acetate, propylene glycol monobutylether, dipropylene glycol monomethylether, dipropylene glycol dimethylether, dipropylene glycol methylethylether, ethyl formate, propyl formate, butyl formate, amyl formate, methyl acetate, ethyl acetate, propyl acetate, butyl acetate, methyl propionate, ethyl propionate, methyl butyrate, ethyl butyrate, dimethylformamide, dimethylsulfoxide, dioxane, acetone, methylethylketone, cyclopentanone, cyclohexanone, methylcyclohexanone, discetonealcohol, acetylacetone, γ-butyrolactone. These solvents can be used singly or in combination.

The coating method for coating the light sensitive composition on a support includes a conventional coating method such as whirl coating, dip coating, air-knife coating, spray coating, air-spray coating, static air-spray coating, roll coating, blade coating or curtain coating. The coating amount is preferably 0.05 to 5.0 g/m$^2$ as a solid, although the amount varies depending on the usage.

When processing a presensitized lithographic printing plate in the invention, conventional and ordinary methods are used. Namely, a presensitized lithographic printing plate is exposed through a transparent original image having therein a line image and a screen image, and then is developed by a water developing solution, thereby, it is possible to obtain a negative relief image for the original image. A light source of active light suitable for the exposure includes a carbon arc lamp, a mercury lamp, a xenon lamp, a metal halide lamp, a strobe, and a laser beam. A light-sensitive composition in the invention is sufficiently sensitive to a visible laser beam such as argon ion laser, and is preferably used for scanning exposure conducted by the visible laser beam such as argon ion laser based on digitized information.

When using an array-type light source such as a light-emitting diode array, or when exposure-controlling a light source such as a halogen lamp, a metal halide lamp and a tungsten lamp with an optical shutter material such as a liquid crystal or PLZT, digital exposure according to an image signal can be performed. In this case, it is possible to write in directly without using a mask blank.

In the case of a laser beam, it is suitable for writing in directly without using a mask blank, because it is possible to collimate the rays into a beam and thereby to conduct scanning exposure in accordance with image data. When laser is used ad a light source, it is easy to narrow down an exposure area to be in a minimum size and thereby it is possible to form an image with high resolution.

Laser sources used in the invention include, provided that the laser source has its oscillation wavelength in a visible light zone, well-known solid state laser such as YAG laser and its second harmonic, gas laser such as He—Ne laser, $CO_2$ laser, Ar ion laser, Kr ion laser and He—Cd laser, and other discharged and excited molecule laser, ??? laser, chemical laser, dye laser and semiconductor laser. Among them, the second harmonic of YAG laser, He—Ne laser, semiconductor laser and Ar ion laser are preferable.

Among semiconductor lasers, it is preferable to use the so-called single mode laser diode as one wherein a $1/e^2$ diameter is easily narrowed down to several μm—several tens μm at a focal point without lowering optical efficiency greatly.

A light source other than laser includes a light-emitting diode (LED). The LED and semiconductor laser are easily used as an array wherein a plurality of light-emitting elements are integrated.

When a wavelength of 400–550 nm is required as that of a light source, it is also possible to convert to a half-wave length by combining semiconductor later and an element having nonlinear optics effect or combining YAG laser and an element having nonlinear optics effect.

A scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are more suitable for high density recording because they make it easy to enhance a precision of an optical system. In the case of the method of scanning on an outer surface of a cylinder, it is easy to enhance a scanning speed by raising the speed of rotation of a drum, but enhancement of the speed of rotation tends to cause charging on a recording material, resulting in attraction of dust which creates an image defect.

In the case of the so-called multi-channel exposure wherein a plurality of light-emitting elements are used simultaneously, the method of scanning on an outer surface of a cylinder is optimum.

The developer for developing a presensitized lithographic printing plate using the light sensitive composition of the invention may be any conventional developer, and is preferably a solution containing a specific organic solvent, an alkali agent and water as essential components. The specific solvent herein referred to is a solvent having a solubility in 20° C. water of 10 weight % or less which is capable of dissolving or swelling non-image portions of the light sensitive layer in the developer containing the solvent. Such a solvent may be any solvent, if the solvent has the above characteristics, and the examples thereof includes carboxylates such as ethyl acetate, propyl acetate, butyl acetate, amyl acetate, benzyl acetate, ethylene glycol monobutylacetate, butyl lactate and butyl levulinate, ketones such as ethylbutyl ketone, methylisobutyl ketone and cyclohexanone, alcohols such as ethylene glycol monobutylether, ethylene glycol benzylether, ethylene glycol monophenylether, benzyl alcohol, methylphenyl carbinol, n-amyl alcohol and metyl amyl alcohol, an alkyl-substituted aromatic hydrocarbon such as xylene and halogenated hydrocarbons such as methylene dichloride, ethylene dichloride and monochlorobenzene. The solvent may be used one kind or more. Among these solvents, ethylene glycol monophenylether or benzyl alcohol is especially preferable. The solvent content of the developer is ordinarily 0.001 to 20 weight %, and preferably 0.01 to 10 weight %.

The alkali agent contained in the developer includes sodium silicate, potassium silicate, sodium hydroxide, potassium hydroxide, lithium hydroxide, a di or trisodium phosphate, a di or triammonium phosphate, sodium metasilicate, sodium carbonate, potassium carbonate, ammonia, monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, triisopropanolamine, ethyleneamine and ethylenediamine.

The preferable are potassium silicate, sodium silicate, disodium phosphate, sodium carbonate, sodium bicarbonate, potassium carbonate, monoethanolamine, diethanolamine and triethanolamine. The alkali agent may be used singly or in combination.

The ordinary content of these alkaline agents in a developing solution is 0.05–8 wt % and preferable content is 0.5–6 wt %.

For further enhancement of storage stability and printing durability, it is preferable to make water-soluble sulfite to be contained in a developing solution as occasion demands. As a sulfite of such type, an alkali metal sulfite or an alkali earth metal sulfite is preferable, and there are given, for example, sodium sulfite, potassium sulfite, lithium sulfite and magnesium sulfite. Ordinary content of these sulfites in a developing solution in terms of its composition is 0.05–4 wt %, and preferable content is 0.1–1 wt %.

For accelerating dissolution of aforesaid specific organic solvent in water, it is also possible to cause a certain solubilizing agent to be contained. As the solubilizing agent mentioned above, it is preferable to use low molecular alcohol and ketones which are soluble in water more easily than the specific organic solvent to be used. It is also possible to use anionic surfactants and ampholytic surfactants. As alcohol and ketones mentioned above, it is preferable to use methanol, ethanol, propanol, butanol, acetone, methylethyl ketone, ethyleneglycol monomethyl ether, ethyleneglycol monoethyl ether, methoxybutanol, ethoxybutanol, 4-methoxymethylbutanol and N-methylpyrrolidone, for example. Further, as a surfactant, isopropyl naphthalene sodium sulfonate, n-butyl naphthalene sodium sulfonate, N-methyl-N-pentadecylamino sodium acetate and lauryl sodium sulfate are preferable. Though there is no limitation for an amount of the solubilizing agent such as alcohol and ketones to be used, the amount of about 30 wt % or less for the total of a developing solution is generally preferable.

In the case of a presensitized lithographic printing plate, when it is brought into contact with the developing solution mentioned above, or it is rubbed further after it is subjected imagewise exposure, light-sensitive composition on a non-image portion can be removed thoroughly in 10–60 seconds at about 10°–40° C., without affecting adversely an exposed portion on a light-sensitive layer.

EXAMPLES

Next, the invention will be explained in a concrete form as follows, referring to some examples.

In the following synthesis example, "parts" represents "parts by weight".

Synthesis example 1

Ten parts of methacrylic acid (MMA), 70 parts of methyl methacrylate (MMA), 20 parts of ethyl acrylate (EA), 500 parts of ethanol, and 3 parts of a,a-azobisisobutylonitrile were put in a three neck flask under a nitrogen flow, and they were subjected to chemical reaction for 6 hours in an oil bath at 80° C. under a nitrogen flow. After that, 3 parts of triethylammonium chloride and 1 part of glycidyl methacrylate were added to aforesaid mixture and further subjected to reaction for 3 hours. Thus, vinyl type polymer 1 in the invention was obtained. Mw according to GPC was 30,000.

Synthesis example 2

Ten parts of methacrylic acid, 85 parts of methacrylic acid, 5 parts of acrylonitrile (AN), 500 parts of ethanol, and 3 parts of a,a-azobisisobutylonitrile were put in a three neck flask under a nitrogen flow, and they were subjected to chemical reaction for 6 hours in an oil bath at 80° C. under a nitrogen flow. After that, 3 parts of triethylammonium chloride and 1 part of glicidyl methacrylate (GMA) were added to aforesaid mixture which was further subjected to reaction for 3 hours. Thus, vinyl type polymer 2 in the invention was obtained. Mw according to GPC was 20,000.

Synthesis example 3

Ten parts of methacrylic acid, 70 parts of methyl methacrylate, 20 parts of ethyl acrylate, 500 parts of ethanol, and 3 parts of a,a-azobisisobutylonitrile were put in a three neck flask under a nitrogen flow, and they were subjected to chemical reaction for 6 hours in an oil bath at 80° C. under a nitrogen flow. Thus, polymer 3 was obtained. Mw according to GPC was 50,000.

Synthesis example 4

Ten parts of methacrylic acid, 85 parts of methyl methacrylate, 5 parts of acrylonitrile, 500 parts of ethanol, and 3 parts of a,a-azobisisobutylonitrile were put in a three neck flask under a nitrogen flow, and they were subjected to chemical reaction for 6 hours in an oil bath at 80° C. under a nitrogen flow. After that, 3 parts of triethylammonium chloride and 6 parts of glycidyl methacrylate were added to aforesaid mixture which was further subjected to reaction for 3 hours. Thus, vinyl type polymer 4 in the invention was obtained. Mw according to GPC was 30,000.

Example 1

On 0.24-mm-thick aluminum support 1 subjected to electrolytic roughening treatment employing hydrochloric acid, and then to treatment for making the aluminum support to be hydrophilic with sodium silicate, there was coated light-sensitive solution 1 shown below by the use of a wire bar to obtain a thickness of dried coating of 2.0 $\mu$m, and they were dried for 2 minutes at 80° C. under the condition of light-shielding so that a light-sensitive layer was formed.

Light-sensitive solution 1

Vinyl type polymer 1 (binder 1) (MMA/EA/MAA/unit of Formula (1)=70/20/9/1 (by weight) Mw: 30000) . . . 35.0 parts by weight 3,3'-carbonylbis (diethylamino cumarine) . . . 5.0 parts by weight 3,3',4,4'-tetrakis (t-butyldioxycarbonyl) benzophenone . . . 3.0 parts by weight DPHA/U324A (produced by Nakamura Co. Ltd.) . . . 50.0 parts by weight Phthalocyanine pigment (MHI454:made by Mikuni Shikiso) . . . 1.0 part by weight 2-tert-butyl-6-(3-tert-butyl-2-hydroxy-5-methylbenzyl)-4-methylphenylacrylate . . . 0.5 parts by weight Fluorine-containing surfactant (FC-431 produced by Sumitomo-3M Co. Ltd.) . . . 1.0 part by weight Cyclopentanon/MEK(1/1) was added to obtain a 8% by weight solution.

Further, an over-coat layer coating solution having the following composition was coated by means of an applicator on aforesaid light-sensitive layer in a way to get a thickness of dried coating of 2.0 $\mu$m, and then, was dried for 3 minutes at 80° C. under the condition of light-shielding. Thus, presensitized lithographic printing plate 1 was obtained.

Over-coat layer coating solution

Polyvinyl alcohol (GL-05 made by Nihon Gosei Kagaku Co.) . . . 99 parts by weight Surfactant (F-12: made by Dainihon ink Co. Ltd.) . . . 1 part by weight Water . . . 900 parts by weight The presensitized lithographic printing plate 1 thus prepared was subjected to exposure conducted by a daylight room printer (P-627-HA made by Dainihon Screen Co.), then was dipped in SDN-21(made by Konica Corp.) at 30° C. for 30 seconds so that a light-sensitive layer on an unexposed portion may be dissolved out, and it was washed with water and dried so that an image thus formed was evaluated. In evaluation of printing durability, an image of Ugra plate control wedge PCW82 (made by Mika Denshi Co.) was prepared with an exposure amount that makes a continuous tone wedge to be 3 steps, and then printing was conducted on a printing machine (Heidel GTO) wherein a coated paper, printing ink Hyplus (M) magenta made by Toyo Ink Manufacturing Co.) and dampening water (2.5% SEU-3 aqueous solution made by Konica Corp.) were used, in which stain (developability) on a non-image area of a print at the initial stage in printing (at a point of time of about 3000 prints) was evaluated. In addition, printing durability was further evaluated by continuing printing until the moment when printing defect appears on a solid portion of a print and by counting the number of prints printed up to aforesaid moment. With regard to storage stability, prior to exposure and processing including development, a presensitized lithographic printing plate was stored, under the condition of 55° C./20% RH, for 3 days (DT-3) and 5 days (DT-5), or in a thermostatic chamber (made by TABI ESPEC CORP), under the condition of high humidity such as accelerated aging of 40° C./80%, for 3 days (HT-3) and 5 days (HT-5). After that, the presensitized lithographic printing plate was subjected to exposure and development, and its developability after storage on a non-image area was evaluated. For evaluation of sensitivity, on the other hand, a presensitized lithographic printing plate was wound around a drum so that a protective layer faces the light source, and was exposed to a 30 mW algon ion laser beam while the drum was rotating, in which the rate of rotation of the drum was kept constant under the assumption that the laser beam intensity was on Gaussian distribution, and light intensity ($\mu$W/cm$^2$) wherein a line width of the formed image is the same as that corresponding to 1/e$^2$ of intensity of the laser beam was obtained so that it was multiplied by irradiation time to obtain the energy value.

Example 2

The same test as in Example 1 was conducted except that light-sensitive solution 2 wherein binder 1 in light-sensitive solution 1 was changed to vinyl type polymer 2 (binder 2) (MMA/AN/MAA/unit of Formula (1)=85/5/9/1 Mw:20000) was used in place of light-sensitive solution 1.

Example 3

The same test as in Example 1 was conducted except that light-sensitive solution 3 wherein 2-tert-butyl-6-(3-tert-butyl-2-hydroxy-5-methylbenzyl)-4-methylphenylacrylate in light-sensitive solution 1 was changed to 4-allyl-2,6-di-tert-butylphenol was used in place of light-sensitive solution 1.

Comparative example 1

The same test as in Example 1 was conducted except that light-sensitive solution 4 wherein binder 1 in light-sensitive solution 1 was changed to polymer 3 (binder 3) (MMA/MAA/EA=70/10/20 Mw:50000) was used in place of light-sensitive solution 1.

Example 4

The same test as in Example 1 was conducted except that light-sensitive solution 5 wherein binder 1 in light-sensitive solution 1 was changed to vinyl type polymer 4 (binder 4) (MMA/AN/MAA/unit of Formula (1) 85/5/4/6 Mw:30000) was used in place of light-sensitive solution 1.

Example 5

The same test as in Example 1 was conducted except that light-sensitive solution 6 wherein an added amount of 2-tert-butyl-6-(3-tert-butyl-2-hydroxy-5-methylbenzyl)-4-methylphenylacrylate in light-sensitive solution 1 was changed to 6 wt % was used in place of light-sensitive solution 1.

Example 7

The same test as in Example 1 was conducted except that light-sensitive solution 8 wherein a fluorine-containing surfactant (Megafac F-179 made by Dainihon Ink Co.) in light-sensitive solution 1 was changed to polyethylene glycol 1000 (made by Wako Junyaku Kogyo Co.) was used in place of light-sensitive solution 1.

Example 8

The same test as in Example 1 was conducted except that light-sensitive solution 9 wherein a fluorine-containing surfactant (Megafac F-179 made by Dainihon Ink Co.) in light-sensitive solution 1 was not added was used in place of light-sensitive solution 1.

Example 9

Light-sensitive solution 10

Vinyl type polymer 1 (binder 1) (MMA/EA/MAA/unit of Formula (1)=70/20/9/1 Mw:30000) . . . 35.0 parts by weight 3,340 carbonylbis (diethylamino cumarine) . . . 5.0 parts by weight Diphenyliodonium salt·PF$_6$ . . . 3.0 parts by weight Pentaerythritol tetraacrylate . . . 50.0 parts by weight Phthalocyanine pigment (MH1454;made by Mikuni Shikiso) . . . 1.0 part by weight 2-tert-butyl-6-(3-tert-butyl-2-hydroxy-5-methylbenzyl)-4-methylphenylacrylate . . . 0.5 parts by weight Fluorine-containing surfactant (Megafac F-179:made by Dainihon Ink Co.) . . . 1.0 part by weight PGM/MEK(1/1) was added to obtain a 8% by weight solution.

Further, an over-coat layer was coated in the same way as in Example 1, thus, after treatment, a presensitized lithographic printing plate was obtained.

The presensitized lithographic printing plates thus prepared were evaluated in the same way as in Example 1.

Example 10

The same test as in Example 9 was conducted except that light-sensitive solution 11 wherein a binder in light-sensitive solution 10 was changed to vinyl type polymer 2 (binder 2) (MMA/MAA/AN/unit of Formula (1)=70/20/9/1 Mw:20000) was used in place of light-sensitive solution 10.

Example 11

The same test as in Example 9 was conducted except that light-sensitive solution 12 wherein 2-tert-butyl-6-(3-tert-butyl-2-hydroxy-5-methylbenzyl)-4-methylphenylacrylate in light-sensitive solution 10 was changed to 4-allyl-2,6-di-ter-butylphenol was used in place of light-sensitive solution 10.

Example 12

The same test as in Example 9 was conducted except that light-sensitive solution 13 wherein diphenyliodonium salt·$PF_6$ in light-sensitive solution 10 was changed to triphenylsulfonium salt·$SbF_6$ was used in place of light-sensitive solution 10.

Comparative example 2

The same test as in Example 9 was conducted except that light-sensitive solution 14 wherein a binder in light-sensitive solution 10 was changed to polymer 3 (binder 3) (MMA/MAA/EA=70/10/20 Mw:50000) was used in place of light-sensitive solution 10.

Example 13

The same test as in Example 9 was conducted except that light-sensitive solution 15 wherein a binder in light-sensitive solution 10 was changed to vinyl type polymer 4 (binder 4) (MMA/AN/MAA/unit of Formula (1)=85/5/4/6 Mw:30000) was used in place of light-sensitive solution 10.

Example 14

The same test as in Example 9 was conducted except that light-sensitive solution 16 wherein an added amount of 2-tert-butyl-6-(3-tert-butyl-2-hydroxy-5-methylbenzyl)-4-methylphenylacrylate was made to be 6 wt % was used in place of light-sensitive solution 10.

Comparative example 3

The same test as in Example 9 was conducted except that light-sensitive solution 17 wherein 2-tert-butyl-6-(3-tert-butyl-2-hydroxy-5-methylbenzyl)-4-methylphenylacrylate was not used was used in place of light-sensitive solution 10.

Example 15

The same test as in Example 9 was conducted except that light-sensitive solution 18 wherein a fluorine-containing surfactant (Megafac F-179 made by Dainihon Ink Co.) in light-sensitive solution 10 was changed to polyethylene glycol 1000 (made by Wako Junyaku Kogyo Co.) was used in place of light-sensitive solution 10.

Example 16

The same test as in Example 9 was conducted except that light-sensitive solution 19 wherein a fluorine-containing surfactant (Megafac F-179 made by Dainihon Ink Co.) in light-sensitive solution 10 was not added was used in place of light-sensitive solution 10.

The results of the examples and comparative examples mentioned above are shown in Table 1. Symbols in Table 1 and thereafter have the following meanings.

Stain in printing
  o: No stain on a non-image area of a print
  Δ: Occurrence of slight stain on a non-image area of a print
  X: Occurrence of stain on a non-image area of a print Storage stability
  o: A non-image area is not stained even when stored printing plate is developed.
  oΔ: Slight stain on a non-image area can be observed only through a magnifier when stored printing plate is developed.
  Δ: Slight stain on a non-image area can be observed visually when stored printing plate is developed.
  ΔX: Stain on a non-image area can be observed visually when stored printing plate is developed.
  X: Stain on a non-image area can be observed visually when stored printing plate is developed, but it is difficult to distinguish between an image area and a non-image area due to the stain.
  XX: When trying to develop the stored printing plate, it is impossible to develop.

TABLE 1

| | Sensi-tivity ($\mu J/m^2$) | Stain in printing | Printing durability (sheets) | Storage stability | | | |
|---|---|---|---|---|---|---|---|
| | | | | DT-3 | DT-5 | HT-3 | HT-5 |
| Example 1 | 82 | o | 150,000 | o | o | o | o |
| Example 2 | 95 | o | 160,000 | o | o | o | o |
| Example 3 | 82 | o | 150,000 | o | o | o | o |
| Comparative example 1 | 189 | o | 30,000 | o | o | o | o |
| Example 4 | 60 | Δ | 200,000 | Δ | Δ | Δ | Δ |
| Example 5 | 163 | o | 120,000 | o | o | o | o |
| Example 7 | 189 | o | 80,000 | o | o | x | x |
| Example 8 | 76 | Δ | 150,000 | Δ | Δ | Δx | Δx |
| Example 9 | 96 | o | 100,000 | o | o | o | o |
| Example 10 | 150 | o | 120,000 | o | o | o | o |
| Example 11 | 96 | o | 100,000 | o | o | o | o |
| Example 12 | 150 | o | 120,000 | o | o | o | o |
| Comparative example 2 | 198 | o | 20,000 | o | o | o | o |
| Example 13 | 87 | Δ | 150,000 | Δ | Δ | Δ | Δ |
| Example 14 | 179 | o | 80,000 | o | o | o | o |
| Comparative example 3 | 110 | o | 90,000 | x | x | x | x |
| Example 15 | 198 | o | 80,000 | o | o | Δx | Δx |
| Example 16 | 99 | Δ | 80,000 | Δ | Δ | Δx | Δx |

Examples 17–20 and comparative examples 11∝13

Preparation of support

An aluminum plate having a thickness of 0.24 mm (material 1050, refining H16) was dipped in a 5% sodium hydroxide aqueous solution kept at 65° C. to be degreased for one minute, and then was washed with water. The aluminum plate thus degreased was dipped in a 10% hydrochloric acid aqueous solution kept at 25° C. for one minute to be neutralized, and then was washed with water. After being roughened electrolytically under conditions shown in Table 2, the aluminum plate was subjected to desmutting treatment for 10 seconds in a 5% sodium hydroxide aqueous solution kept at 60° C. The aluminum plate thus desmutted and roughened was subjected to anodizing treatment for one minute in a 15% sulfuric acid aqueous solution under the conditions of temperature 25° C., current density 10A/dm$^2$ and voltage 15V, and was further subjected to sealing at 90° C. in a 3% sodium silicate solution. Thus, aluminum supports 2–6 were prepared. Presensitized lithographic printing plates were prepared in the same manner as in Example 1 except that the combinations of aforesaid aluminum supports 2–6 and light-sensitive solutions were made to be those shown in Table 2. The resulting printing plates were evaluated in the same way as in Example 1. The results are shown in Table 3.

TABLE 2

|  | Support No. | Electrolyte | Electrolysis conditions Temperature | Quantity of electricity | Ra ($\mu$m) | RZ ($\mu$m) | Light-sensitive solution |
|---|---|---|---|---|---|---|---|
| Example 17 | 2 | Nitric acid (2.0 wt %) | 35° C. | 300 | 0.43 | 3.06 | 1 |
| Example 18 | 3 | Nitric acid (2.0 wt %) | 35° C. | 400 | 0.51 | 3.21 | 1 |
| Example 19 | 3 | Nitric acid (2.0 wt %) | 35° C. | 400 | 0.51 | 3.21 | 2 |
| Example 20 | 4 | Nitric acid (2.0 wt %) | 35° C. | 800 | 0.76 | 5.12 | 2 |
| Comparative example 11 | 3 | Nitric acid (2.0 wt %) | 35° C. | 400 | 0.51 | 3.21 | 4 |
| Comparative example 12 | 5 | Nitric acid (2.0 wt %) | 35° C. | 900 | 0.81 | 5.23 | 4 |
| Comparative example 13 | 6 | Nitric acid (2.0 wt %) | 35° C. | 100 | 0.28 | 2.96 | 4 |

TABLE 3

|  | Sensitivity ($\mu$J/m$^2$) | Stain in printing | Printing durability (sheets) | Storage stability DT-3 | DT-5 | HT-3 | HT-5 |
|---|---|---|---|---|---|---|---|
| Example 17 | 84 | ○ | 150,000 | ○ | ○ | ○ | ○ |
| Example 18 | 79 | ○ | 160,000 | ○ | ○ | ○ | ○ |
| Example 19 | 74 | ○ | 150,000 | ○ | ○ | ○ | ○ |
| Example 20 | 69 | ○ | 170,000 | ○ | ○ | ○ | ○ |
| Comparative example 11 | 60 | xx | 150,000 | x | x | xx | xx |
| Comparative example 12 | 37 | xx | 200,000 | x | x | xx | xx |
| Comparative example 13 | 102 | x | 100,000 | Δ | Δ | Δx | Δx |

Example 21

The same test as in Example 1 was conducted except that a presensitized lithographic printing plate prepared by the use of aforesaid light-sensitive solution 1 in the same way as in Example 1 was developed with developing solution 1 having the following composition.

Developing solution 1

Benzyl alcohol . . . 360 parts by weight

Diethanolamine . . . 210 parts by weight

Pelex NBL (made by Kao, sodium t-butylnaphthalene sulfonate) . . . 180 parts by weight Potassium sulfite . . . 90 parts by weight Water . . . 3000 parts by weight pH=11.8, amount of organic solvent: 14.8 wt %

Example 22

The same test as in Example 21 was conducted except that aforesaid light-sensitive solution 2 was used in place of aforesaid light-sensitive solution 1.

Example 23

The same test as in Example 21 was conducted except that developing solution 2 stated below was used in place of developing solution 1.

Comparative example 14

The same test as in Example 21 was conducted except that aforesaid light-sensitive solution 4 was used in place of aforesaid light-sensitive solution 1.

Example 24

The same test as in Example 21 was conducted except that aforesaid light-sensitive solution 5 was used in place of aforesaid light-sensitive solution 1.

Developing solution 2

A potassium silicate (made by Nihon Kagaku Kogyo Co., SiO$_2$=26%, K$_2$O=13.5%) . . . 400 parts by weight Potassium hydroxide (50% aqueous solution) . . . 195 parts by weight N-phenylethanolamine . . . 6.0 parts by weight Propylene glycol . . . 50 parts by weight P-t-butyl benzoate . . . 150 parts by weight Potassium sulfite . . . 300 parts by weight Emulgen 147 (nonionic activator; made by Kao Co.) . . . 5.0 parts by weight Gluconic acid solution (50% aqueous solution) . . . 100 parts by weight Triethanolamine . . . 25.0 parts by weight Water . . . 11500 parts by weight pH=12.5, amount of organic solvent: 7 wt %

The results of Examples 21–24 and comparative example are shown in Table 4.

TABLE 4

| | Sensitivity ($\mu J/m^2$) | Stain in printing | Printing durability (sheets) | Storage stability | | | |
|---|---|---|---|---|---|---|---|
| | | | | DT-3 | DT-5 | HT-3 | HT-5 |
| Example 17 | 84 | ○ | 150,000 | ○ | ○ | ○ | ○ |
| Example 21 | 78 | ○ | 150,000 | ○ | ○ | ○ | ○ |
| Example 22 | 85 | ○ | 140,000 | ○ | ○ | ○ | ○ |
| Example 23 | 88 | ○ | 150,000 | ○ | ○ | ○ | ○ |
| Comparative example 14 | 190 | ○ | 80,000 | ○ | x | x | x |
| Example 24 | 61 | ○ | 200,000 | x | x | xx | xx |

Example 25

The same test as in Example 1 was conducted except that light-sensitive solution 20 wherein 2-tert-butyl-6-(3-tert-butyl-2-hydroxy-5-methylbenzyl-4-methylphenylacrylate in light-sensitive solution 1 was changed to pentaerythrityl-tetrakis [3-(3,5-di-tert-butyl-4-hydroxyphenyl) propionate] (phenol type polymerization inhibitor) was used as a light-sensitive solution.

Example 26

The same test as in Example 1 was conducted except that light-sensitive solution 21 wherein 2-tert-butyl-6-(3-tert-butyl-2-hydroxy-5-methylbenzyl-4-methylphenylacrylate in light-sensitive solution 1 was changed to octyldiphenylamine (amine type polymerization inhibitor) was used as a light-sensitive solution.

Example 27

The same test as in Example 1 was conducted except that light-sensitive solution 22 wherein 2-tert-butyl-6-(3-tert-butyl-2-hydroxy-5-methylbenzyl-4-methylphenylacrylate in light-sensitive solution 1 was changed to dilaurylthiodipropionate (sulfur type polymerization inhibitor) was used as a light-sensitive solution.

Example 28

The same test as in Example 1 was conducted except that light-sensitive solution 23 wherein 2-tert-butyl-6-(3-tert-butyl-2-hydroxy-5-methylbenzyl-4-methylphenylacrylate in light-sensitive solution 1 was changed to triphenylphosphite (phosphor type polymerization inhibitor) was used as a light-sensitive solution.

Example 29

The same test as in Example 9 was conducted except that light-sensitive solution 24 wherein 2-tert-butyl-6-(3-tert-butyl-2-hydroxy-5-methylbenzyl-4-methylphenylacrylate in light-sensitive solution 10 was changed to pentaerythrityl-tetrakis [3-(3,5-di-tert-butyl-4-hydroxyphenyl) propionate] (phenol type polymerization inhibitor) was used as a light-sensitive solution.

Example 30

The same test as in Example 1 was conducted except that light-sensitive solution 25 wherein 2-tert-butyl-6-(3-tert-butyl-2-hydroxy-5-methylbenzyl-4-methylphenylacrylate in light-sensitive solution 10 was changed to octyldiphenylamine (amine type polymerization inhibitor) was used as a light-sensitive solution.

Example 31

The same test as in Example 1 was conducted except that light-sensitive solution 26 wherein 2-tert-butyl-6-(3-tert-butyl-2-hydroxy-5-methylbenzyl-4-methylphenylacrylate in light-sensitive solution 10 was changed to dilaurylthiodipropionate (sulfur type polymerization inhibitor) was used as a light-sensitive solution.

Example 32

The same test as in Example 1 was conducted except that light-sensitive solution 27 wherein 2-tert-butyl-6-(3-tert-butyl-2-hydroxy-5-methylbenzyl-4-methylphenylacrylate in light-sensitive solution 10 was changed to triphenylphosphite (phosphor type polymerization inhibitor) was used as a light-sensitive solution.

The results of aforesaid tests 25–32 are shown in Table 5 below.

TABLE 5

| | Sensitivity ($\mu J/m^2$) | Stain in printing | Printing durability (sheets) | Storage stability | | | |
|---|---|---|---|---|---|---|---|
| | | | | DT-3 | DT-5 | HT-3 | HT-5 |
| Example 25 | 92 | ○ | 140,000 | ○ | Δ | ○ | Δ |
| Example 26 | 93 | ○ | 130,000 | ○ | Δ | ○ | Δ |
| Example 27 | 92 | ○ | 130,000 | ○ | Δ | ○ | Δ |
| Example 28 | 93 | ○ | 130,000 | ○ | Δ | ○ | Δ |
| Example 29 | 101 | ○ | 90,000 | ○ | ○Δ | ○ | ○Δ |
| Example 30 | 101 | ○ | 90,000 | ○ | Δ | ○ | Δ |
| Example 31 | 101 | ○ | 90,000 | ○ | Δ | ○ | Δ |
| Example 32 | 101 | ○ | 90,000 | ○ | Δ | ○ | Δ |

Aforesaid abbreviations stand for the following compounds.
MMA: Methylmethacrylate
EA: Ethylacrylate
MAA: Methylacrylate
PGM: Propylene glycol monomethylether
MEK: Methylethyl ketone

What is claimed is:

1. A light sensitive composition comprising
   (a) a vinyl polymer having a unit represented by the following Formula (1) and a carboxyl group, (b) a monomer, oligomer or polymer containing at least one polymerizable double bond in its molecule, (c) a photopolymerization initiator and (d) a polymerization inhibitor, which is a hindered phenol having an acroyl, methacroyl, vinyl or allyl group,

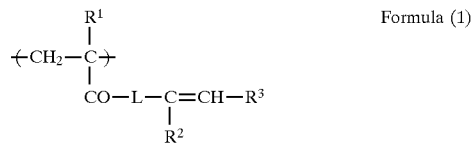

Formula (1)

wherein $R^1$ and $R^2$ independently represent a hydrogen atom or a methyl group; $R^3$ represents a hydrogen atom, an alkyl group or an aryl group, provided that when $R^2$ is a methyl group, $R^3$ is a hydrogen atom; and L represents a divalent linkage group selected from the group consisting of —$CH_2$—CH(OH)$CH_2$—O—, —O$CH_2$—CH(OH)$CH_2$—OCO—, —O$CH_2CH_2$—OCONH—$R^4$—NHCOO$CH_2$— in which $R^4$ represents p-phenylene, —O$CH_2CH_2$OCO$CH_2CH_2$COO$CH_2$— or —O$CH_2CH_2$OCO—$R^5$—COO$CH_2$— in which $R^5$ represents o-phenylene.

2. The light sensitive composition of claim 1, wherein L in Formula (1) represents —O$CH_2$CH(OH)$CH_2$—OCO—.

3. The light sensitive composition of claim 1, wherein the content in the polymer of the unit represented by Formula (1) is 0.001 to 5 weight %.

4. The light sensitive composition of claim 1, wherein the vinyl polymer has a carboxyl group content necessary to give an acid value of 3 to 300.

5. The light sensitive composition of claim 1, wherein the polymerization inhibitor content is 0.001 to 5 weight %.

6. The light sensitive composition of claim 1, wherein the photopolymerization initiator is an organic peroxide or an onium salt.

7. The light sensitive composition of claim 6, wherein the onium salt is selected from an iodonium salt and a sulfonium salt.

8. The light sensitive composition of claim 7, wherein the onium salt content is 0.001 to 10 weight %.

9. The light sensitive composition of claim 1, further containing a fluorine-containing surfactant in an amount of 0.001 to 5 weight %.

10. The light sensitive composition of claim 1, further containing a sensitizing agent.

* * * * *